(12) United States Patent
Nagarajan

(10) Patent No.: US 11,394,464 B2
(45) Date of Patent: Jul. 19, 2022

(54) INTEGRATED COHERENT OPTICAL TRANSCEIVER, LIGHT ENGINE

(71) Applicant: Marvell Asia Pte, Ltd., Singapore (SG)

(72) Inventor: Radhakrishnan L. Nagarajan, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 16/928,845

(22) Filed: Jul. 14, 2020

(65) Prior Publication Data

US 2020/0341193 A1    Oct. 29, 2020

Related U.S. Application Data

(63) Continuation of application No. 16/357,095, filed on Mar. 18, 2019, now Pat. No. 10,754,091.

(51) Int. Cl.

| | |
|---|---|
| G02B 6/42 | (2006.01) |
| H04B 10/40 | (2013.01) |
| G02B 6/12 | (2006.01) |
| G02B 6/126 | (2006.01) |
| H01S 5/00 | (2006.01) |

(Continued)

(52) U.S. Cl.
CPC ......... *H04B 10/40* (2013.01); *G02B 6/12004* (2013.01); *G02B 6/126* (2013.01); *G02B 6/428* (2013.01); *G02B 6/4246* (2013.01); *H01S 3/13* (2013.01); *H01S 5/0085* (2013.01); *H01S 5/0234* (2021.01); *G02B 6/1228* (2013.01); *G02B 2006/12061* (2013.01); *G02B 2006/12097* (2013.01); *G02B 2006/12121* (2013.01); *G02B 2006/12123* (2013.01); *G02B 2006/12142* (2013.01); *H01S 5/0687* (2013.01); *H04J 14/02* (2013.01)

(58) Field of Classification Search
CPC .................................................... G02B 6/4226
See application file for complete search history.

(56) References Cited

U.S. PATENT DOCUMENTS

| | | |
|---|---|---|
| 10,754,091 B1 | 8/2020 | Nagarajan |
| 10,838,145 B2 | 11/2020 | Nagarajan |

(Continued)

FOREIGN PATENT DOCUMENTS

WO    WO-2019169507 A1 * 9/2019 ........... G02F 1/0121

Primary Examiner — Eric Wong

(57) ABSTRACT

An coherent transceiver includes a single silicon photonics substrate configured to integrate a laser diode chip flip-mounted and coupled with a wavelength tuning section to provide a laser output with tuned wavelengths which is split in X:Y ratio partly into a coherent receiver block as local-oscillator signals and partly into a coherent transmitter block as a light source. The coherent receiver includes a polarization-beam-splitter-rotator to split a coherent input signal to a TE-mode signal and a TM*-mode signal respectively detected by two 90-deg hybrid receivers and a flip-mounted TIA chip assisted by two local-oscillator signals from the tunable laser device. The coherent transmitter includes a driver chip flip-mounted on the silicon photonics substrate to drive a pair of Mach-Zehnder modulators with 90-degree shift in quadrature-phase branches to modulate the laser output to two polarized signals with I/Q modulation and uses a polarization-beam-rotator-combiner to combine them as a coherent output signal.

20 Claims, 17 Drawing Sheets

(51) Int. Cl.
*H01S 3/13* (2006.01)
*H01S 5/0234* (2021.01)
*G02B 6/122* (2006.01)
*H04J 14/02* (2006.01)
*H01S 5/0687* (2006.01)

(56) References Cited

U.S. PATENT DOCUMENTS

2015/0023627 A1   1/2015  Kimura et al.
2016/0033728 A1   2/2016  Kish, Jr.
2017/0163000 A1*  6/2017  Evans ................. H01S 5/06256
2017/0163001 A1   6/2017  Evans
2019/0089476 A1*  3/2019  Kish, Jr. ............... H04B 10/614
2020/0322057 A1* 10/2020  Cai ........................ H04B 10/61

* cited by examiner

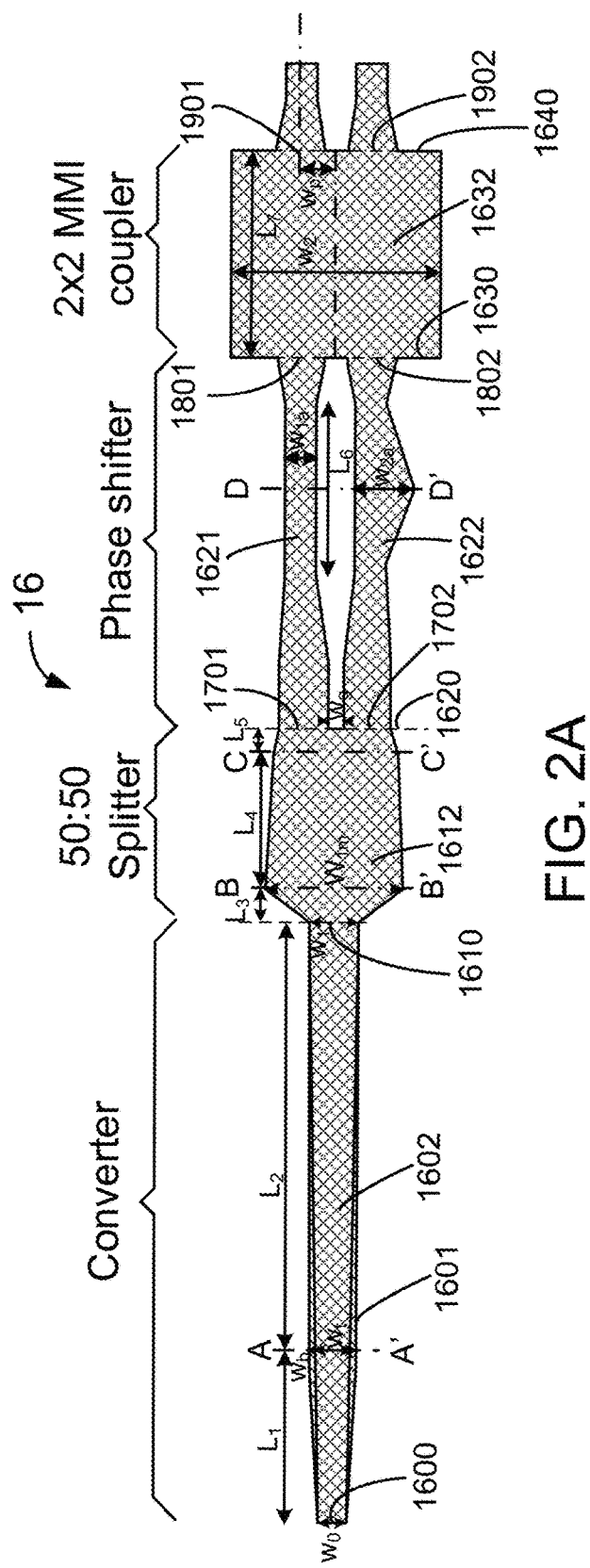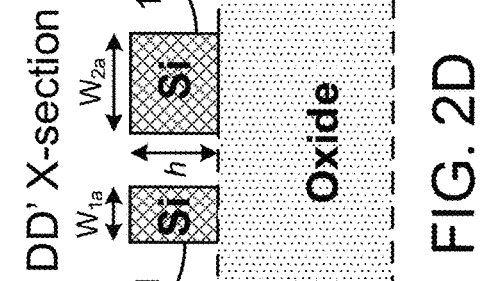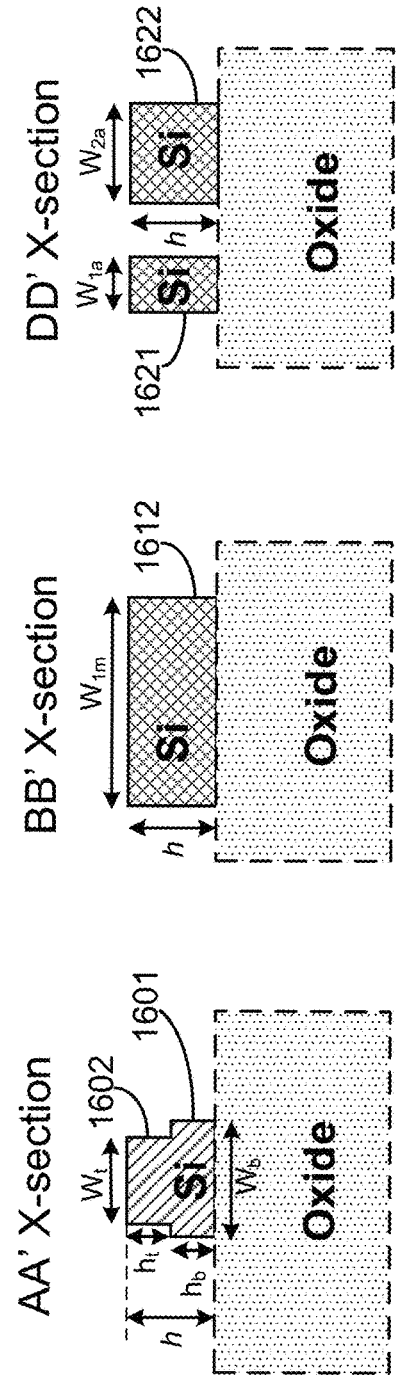
FIG. 2A
FIG. 2B
FIG. 2C
FIG. 2D

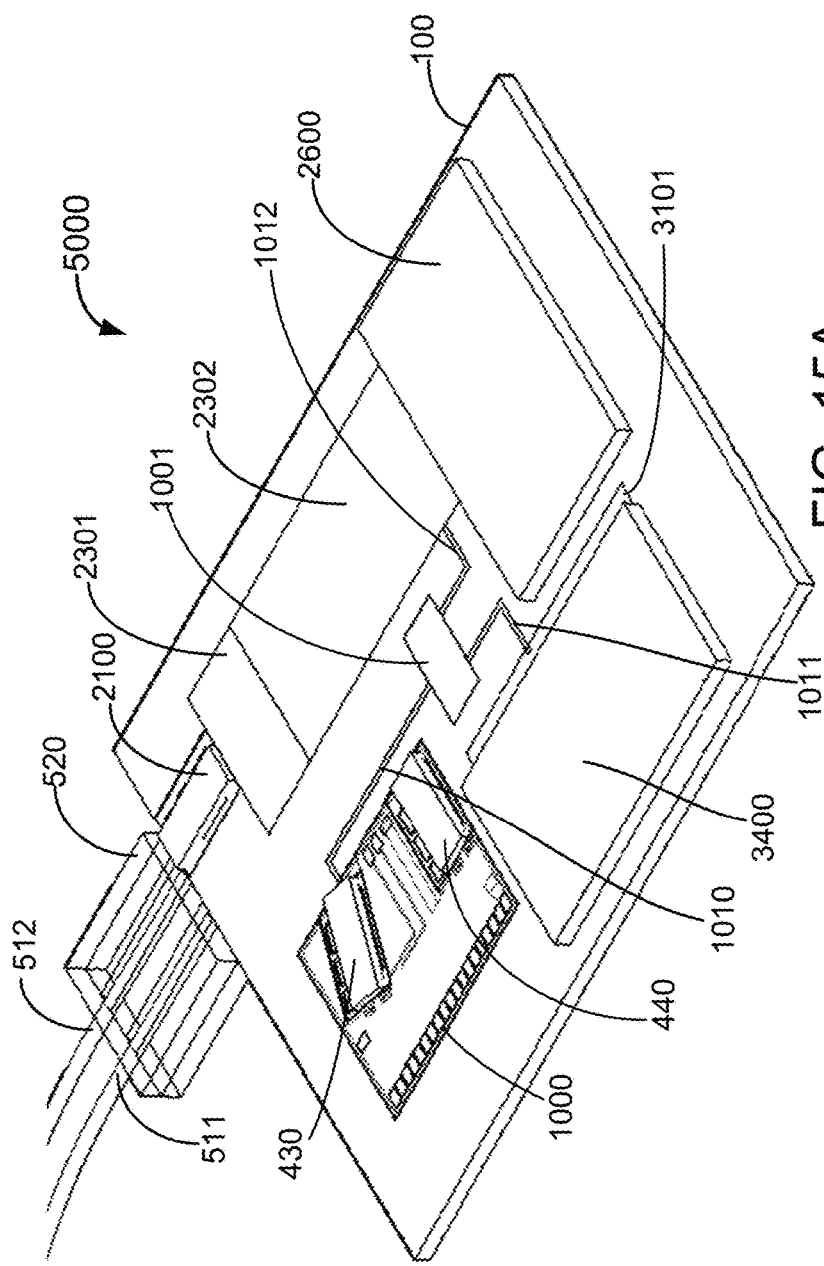
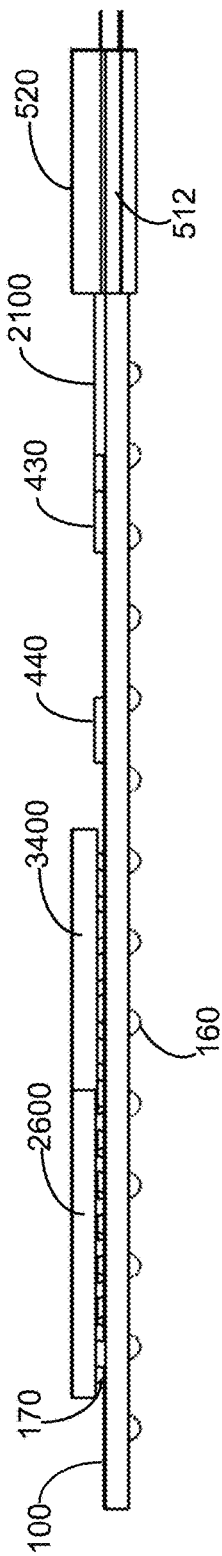
FIG. 15A
FIG. 15B

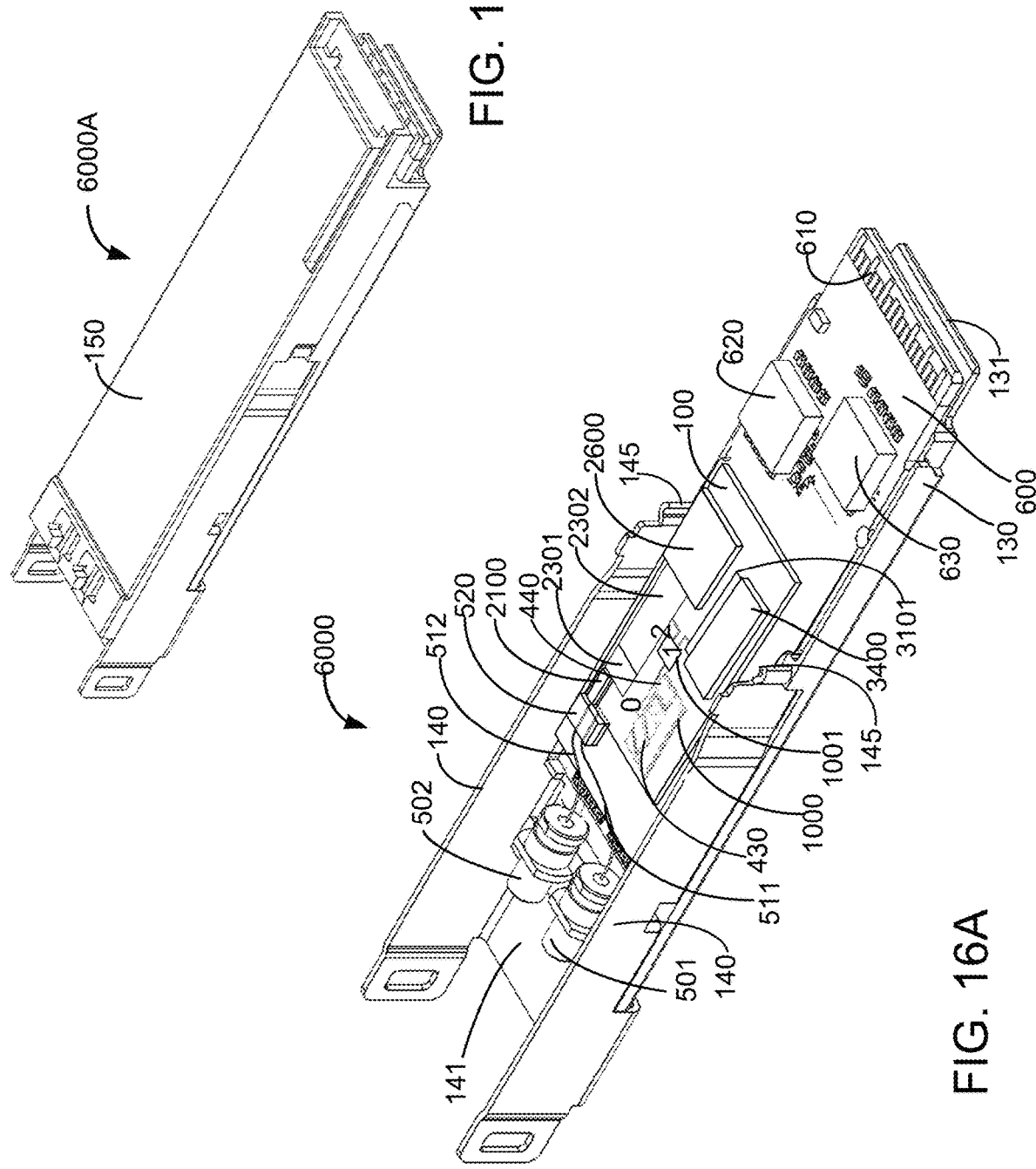

INTEGRATED COHERENT OPTICAL TRANSCEIVER, LIGHT ENGINE

CROSS-REFERENCE TO RELATED APPLICATIONS

This application is continuation of and claims priority to U.S. patent application Ser. No. 16/357,095, filed on Mar. 18, 2019, commonly assigned and incorporated by reference herein for all purposes.

BACKGROUND OF THE INVENTION

The present invention relates to optical telecommunication techniques. More particularly, the present invention provides a compact integrated coherent transceiver based on silicon photonics platform, a method for forming the same, and a system having the same.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. Chip-scale wide-band wavelength-tunable lasers have been of interest for many applications such as wide-band DWDM communication and wavelength-steered light detection and ranging (LIDAR) sensing. More recently, optical components are being integrated on silicon (Si) substrates for fabricating large-scale photonic integrated circuits that co-exist with micro-electronic chips. A whole range of photonic components, including filters, (de)multiplexers, splitters, modulators, and photodetectors, have been demonstrated, mostly in the silicon-on-insulator (SOI) platform. The SOI platform is especially suited for standard WDM communication bands at 1300 nm and 1550 nm, as silicon (n=3.48) and its oxide $SiO_2$ (n=1.44) are both transparent, and form high-index contrast, high-confinement waveguides ideally suited for medium to high-integration planar integrated circuits (PICs).

Coherent optical fiber communications were studied extensively in the 1980s mainly because high sensitivity of coherent receivers could elongate the unrepeated transmission distance; however, their research and development have been interrupted for nearly 20 years behind the rapid progress in high-capacity wavelength-division multiplexed (WDM) systems using erbium-doped fiber amplifiers (ED-FAs). Not long ago, the demonstration of digital carrier phase estimation in coherent receivers has stimulated a widespread interest in coherent optical communications again. The fact is, the digital coherent receiver enables us to employ a variety of spectrally efficient modulation formats such as phase shift keying (PSK) and quadrature amplitude modulation (QAM) without relying upon a rather complicated optical phase-locked loop. In addition, since the phase information is preserved after detection, we can realize electrical post-processing functions such as compensation for chromatic dispersion and polarization-mode dispersion in the digital domain. These advantages of the coherent receiver have enormous potential for innovating existing optical communication systems.

Coherent transmitter has a TE and TM path. Silicon photonics chip, however, operates essentially only in a TE only configuration. Several technical challenges exist for making polarization-independent or wavelength tunable passive and active components as well as integrating these components to form a coherent optical transceiver in a compact silicon photonics platform. Therefore, improved techniques and methods of forming an integrated compact coherent transceiver are desired.

BRIEF SUMMARY OF THE INVENTION

The present invention relates to optical telecommunication techniques. More particularly, the present invention provides an integrated compact coherent transceiver in silicon-photonics platform. Merely by example, the present invention discloses a coherent transmitter block including a polarization independent semiconductor optical amplifier (SOA) coupled via polarization beam rotator combiner (PBRC) to a driver electronics chip with both in-phase and quadrature-phase modulations of broadband signals from an independently packaged wide-band tunable laser with silicon-photonics tuning section, and a coherent receiver block including polarized hybrid receivers converting TE-polarized optical signals split by a polarization beam splitter rotator (PBSR) to electrical signals for a transimpedance amplifier (TIA) electronics chip, and a method of integrating these components to form a coherent transceiver in a compact silicon photonics platform for wide-band DWDM optical communications, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

With the increase in the transmission capacity of WDM systems, coherent technologies attracted a renewal of widespread interest after 2000. The motivation is to develop methods for meeting the ever-increasing bandwidth demand with multi-level modulation formats based on coherent technologies. The first step in the revival of coherent optical communications research was triggered by quadrature phase-shift keying (QPSK) modulation/demodulation experiment featuring optical in-phase and quadrature (IQ) modulation (IQM) and optical delay detection. In such a scheme, we can double the bit rate while maintaining the symbol rate, and a 40-Gb/s differential QPSK (DQPSK) system has been put into practical use. Coherent transmitter has a transverse electric (TE) mode and transverse magnetic (TM) mode path. Silicon photonics chip operates essentially only in a TE only configuration. The signal has both TE mode and TM mode parts. To accomplish a silicon-photonics based integration of coherent transceiver, we need to have at least the following two components on the silicon photonics chip: 1) Polarization Beam Rotator Combiner (PBRC) integrated with a polarization-independent semiconductor optical amplifier (SOA) and driver in the coherent transmitter and 2) Polarization Beam Splitter Rotator (PBSR) integrated with electronics like transimpedance amplifier (TIA) in the coherent receiver, and to integrate the coherent transmitter and receiver with a tunable laser provided in a flip-chip.

In an embodiment, the present invention provides a tunable laser device based on silicon photonics. The tunable laser device includes a substrate configured with a patterned region comprising one or more vertical stoppers, an edge stopper facing a first direction, a first alignment feature structure formed in the patterned region along the first direction, and a bond pad disposed between the vertical stoppers. The tunable laser device further includes an integrated coupler built in the substrate located at the edge stopper. Additionally, the tunable laser device includes a laser diode chip including a gain region covered by a P-type electrode and a second alignment feature structure formed beyond the P-type electrode, the laser diode chip being flipped to rest against the one or more vertical stoppers with the P-type electrode attached to the bond pad and the gain region coupled to the integrated coupler. Furthermore, the tunable laser device includes a tuning filter fabricated in the substrate and coupled via a wire waveguide to the integrated coupler.

In a specific embodiment, the present invention provides a coherent transceiver integrated on silicon photonics substrate. The coherent transceiver includes a substrate member and a tunable laser device comprising a laser diode chip having a gain region with a p-side electrode flipped down and mounted on the substrate member. The gain region is coupled with a wavelength tuning section formed in the substrate member to tune wavelengths of a laser light outputted from the gain region to a waveguide in the substrate member. The coherent transceiver further includes a first power splitter coupled to the waveguide to split the laser light to a first light and a second light. Additionally, the coherent transceiver includes a coherent receiver block including at least two 90° hybrid receivers coupled respectively to two outputs of a polarization beam splitter rotator in the substrate member to receive a coherent input signal from a coherent optical network. The coherent transceiver also is configured to have the two 90° hybrid receivers to couple with two outputs of a second power splitter to receive two local-oscillator signals split from the first light for assisting detections of a transverse electric (TE) mode signal and a transverse magnetic (TM) mode signal in the coherent input signal. Furthermore, the coherent transceiver includes a coherent transmitter block including at least a pair of in-phase/quadrature-phase modulators in the substrate member to respectively modulate two parts split from the second light to two I/Q-modulated signals in TE-mode, a polarization beam rotator combiner in the substrate member to rotate one of the two I/Q modulated signals to a TM-mode signal and combine with the other one of two I/Q modulated signals in TE-mode to generate a coherent output signal transmitted through a polarization-independent semiconductor optical amplifier to the coherent optical network.

In another specific embodiment, the present invention provides a module package of an integrated coherent optical transceiver. The module package includes a metal case having two side members joint by a joint member coupled with a bottom member and clipped with a lid member. The module package further includes a printed circuit board (PCB) disposed on the bottom member with multiple electrical pins located near a back end of the metal case and a silicon photonics substrate with a board grid array at bottom mounted on the PCB. Additionally, the module package includes a coherent transceiver chip integrated on the silicon photonics substrate including one input port and one output port respectively disposed on a front end of the metal case and coupled to the silicon photonics substrate via a first fiber and a second fiber. The coherent transceiver chip includes further a tunable laser device including two laser diode chips coupled with a wavelength tuning section embedded in a first region of the silicon photonics substrate and configured to output a laser light. Furthermore, the coherent transceiver chip includes a transimpedance amplifier (TIA) chip flip-mounted on a second region of the silicon photonics substrate and a driver chip flip-mounted on a third region of the silicon photonics substrate. Moreover, the coherent transceiver chip includes a silicon photonics circuit formed in a fourth region of the silicon photonics substrate. The silicon photonics circuit is configured to couple with the first fiber to receive a coherent input light signal and to couple with the tunable laser device to receive a first portion of a laser light as local oscillator signals to assist detections of both TM-mode and TE-mode light signals in the coherent input light signal by the TIA chip. The silicon photonics circuit is also configured to use the driver chip to drive modulations of a second portion of the laser light to generate a coherent output light signal outputted to the second fiber.

In another specific embodiment, the present invention provides a light engine device including an optical coherent transceiver integrated on a semiconductor substrate member. The light engine device includes a substrate member comprising a surface region. The light engine device further includes an optical input configured to an incoming fiber device and an optical output configured to an outgoing fiber device. Additionally, the light engine device includes a transmit path provided on the surface region. The transmit path includes a polarization independent optical amplifier device coupled to the optical output. The transmit path also includes a polarization beam rotator combiner device coupled to the polarization independent optical amplifier and coupled to the optical output. The transmit path further includes a dual polarization I/Q Mach Zehnder modulator device coupled to the polarization beam rotator combiner device and coupled to the optical output. The transmit path again includes a driver device coupled to the dual polarization I/Q Mach Zehnder modulator device and configured to drive an electrical signal to the dual polarization I/Q Mach Zehnder modulator. Furthermore, the transmit path includes a tunable laser device comprising a laser diode chip having a gain region with a p-side electrode flipped down and mounted on the substrate member. The gain region is coupled with a wavelength tuning section formed in the substrate member to tune wavelengths of a laser light outputted from the gain region to a waveguide in the substrate member. Moreover, the transmit path includes a first power splitter coupled to the waveguide to split the laser light to a first light and a second light. The second light is coupled to the dual polarization I/Q Mach Zehnder modulator device. Further, the light engine device also includes a receive path provided on the surface region. The receive path includes a second power splitter coupled to the first light. The receive path further includes a pair of 90° hybrid receivers. Each of the pair of 90° hybrid receivers includes a photo detector device and a hybrid mixer device, coupled respectively to two outputs of a polarization beam splitter rotator in the substrate member to receive the optical input and to two outputs of the second power splitter to receive the first light from the tunable laser device for assisting detections of a transverse electric (TE) mode signal and a transverse magnetic (TM) mode signal in the coherent input signal. Furthermore, the receive path includes a transimpedance amplifier coupled to each of the 90° hybrid receivers and coupled to each of the photo detector devices that convert a combination of the first light with the optical input into an electrical signal to be transmitted to using the transimpedance amplifier device. The light engine device further includes a heterogeneous integration configured using the substrate member, the transmit path, and the receive path to form a single silicon photonics device.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 2A is a top-view diagram of a waveguide-based polarization beam splitter-rotator (PBSR) or polarization beam rotator-combiner (PBRC) according to an embodiment of the present invention.

FIG. 2B is a cross-section view along AA' plane of the waveguide-based PBSR or PBRC of FIG. 2A according to an embodiment of the present invention.

FIG. 2C is a cross-section view along BB' plane of the waveguide-based PBSR or PBRC of FIG. 2A according to an embodiment of the present invention.

FIG. 2D is a cross-section view along CC' plane of the waveguide-based PBSR or PBRC of FIG. 2A according to an embodiment of the present invention.

FIG. 15A is a perspective view of an integrated coherent optical transceiver on a silicon photonics substrate according to an embodiment of the present invention.

FIG. 15B is a side view of the integrated coherent optical transceiver on a silicon photonics substrate of FIG. 15A according to an embodiment of the present invention FIG. 16A is a schematic diagram of an open package of an integrated coherent optical transceiver according to an embodiment of the present invention.

FIG. 16B is a schematic diagram of a closed package of the integrated coherent optical transceiver of FIG. 16A according to an embodiment of the present invention.

DETAILED DESCRIPTION OF THE INVENTION

Figure 1:
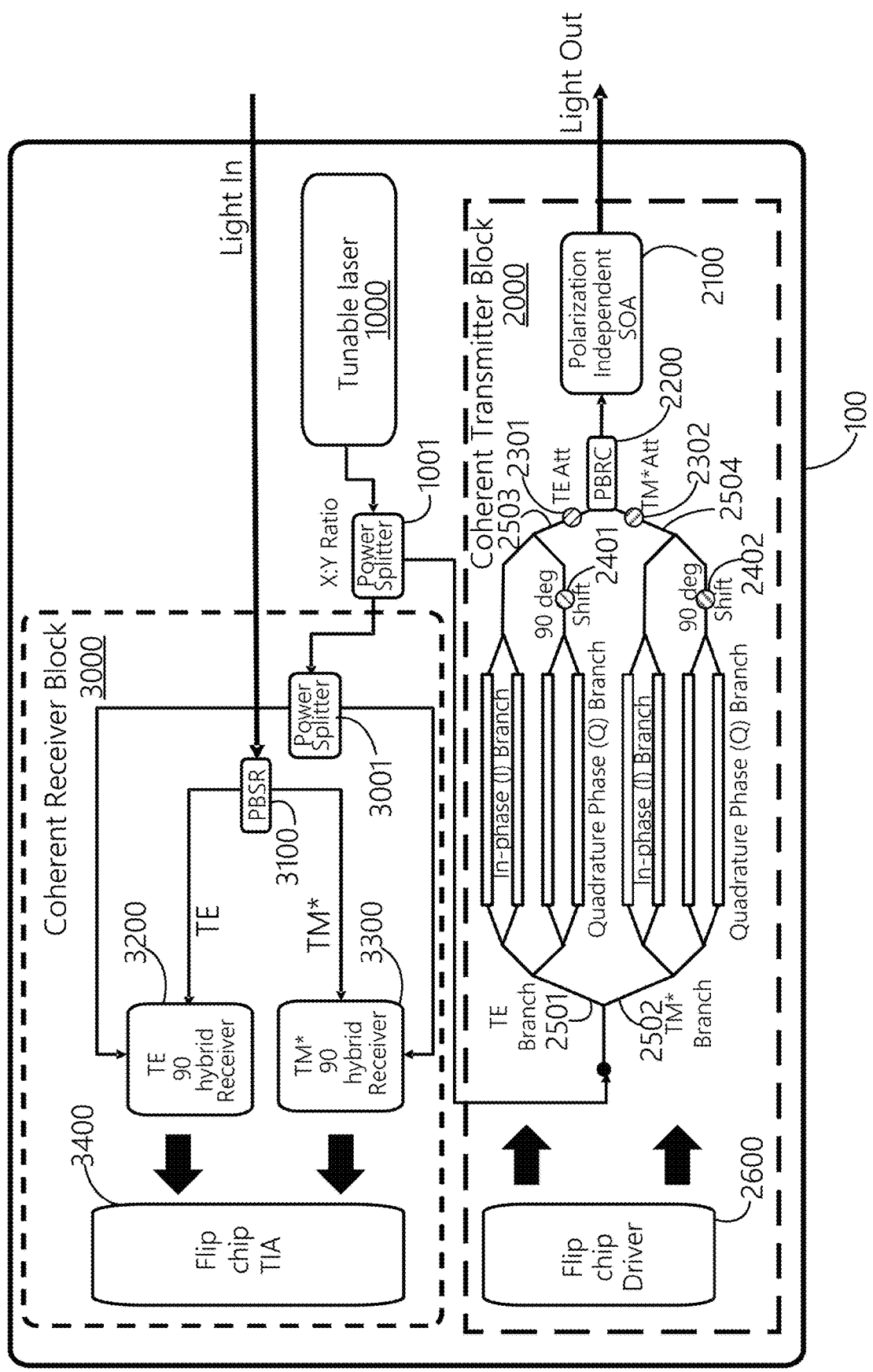
FIG. 1 is a simplified block diagram of a coherent optical transceiver according to an embodiment of the present invention.

The present invention relates to optical telecommunication techniques. More particularly, the present invention provides an integrated compact coherent transceiver in silicon photonics platform. Merely by example, the present invention discloses a coherent transmitter block including a polarization independent semiconductor optical amplifier (SOA) coupled via polarization beam rotator combiner (PBRC) to a driver electronics chip and to an independently packaged wide-band tunable laser with silicon photonics tuning section, and a coherent receiver block including polarized hybrid receivers coupled to transimpedance amplifier (TIA) electronics chip via polarization beam splitter rotator (PBSR), and a method of integrating these components to form a coherent transceiver in a compact silicon photonics platform for wide-band DWDM optical communications, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In an aspect, the present disclosure provides a compact integrated coherent transceiver based on silicon photonics platform. As data transmission-capacity increase in WDM systems, coherent technologies with polarized optical signals also increasingly attract more and more interest over the recent years with motivation of meeting the ever-increasing bandwidth demand using multilevel modulation formats. For example, a digital signal transmitting/receiving scheme is developed for coherent transmission system supported with a quadrature PSK (QPSK) modulation/demodulation featuring optical in-phase and quadrature (I/Q) modulation and optical delay detection. In such a scheme, one symbol carries two bits by using the four-point constellation on the complex plane, therefore, the bit rate is doubled, while keeping the symbol rate, or maintaining the bit rate even with the halved spectral width to realize a large capacity of 100 Gbit/s and more than 100 Gbit/s per channel. Optical coherent I/Q modulation can be realized with Mach-Zehnder (MZ) type push-pull modulators in parallel, between which a n/2-phase shift is given. The I/Q components of the optical carrier is modulated independently with the coherent I/Q modulator, enabling any kind of modulation formats.

FIG. 1 shows simplified block diagram of an integrated coherent optical transceiver according to an embodiment of the present invention. This diagram is merely an example, which should not unduly limit the scope of the claims. One of ordinary skill in the art would recognize many variations, alternatives, and modifications. As shown, the integrated coherent optical transceiver is configured to integrate a silicon-photonics-based tunable laser 1000 with a coherent transmitter block 2000 and a coherent receiver block 3000 on a single silicon photonics substrate 100. Optionally, the tunable laser is a wide-band laser source with its output optical signal tunable over entire C-band or O-band. The wavelength tuning is achieved using a silicon photonics tuning section including a heater-tuned micro-ring resonator filter built in the silicon photonics substrate 100 while a laser diode chip with an InP gain region with p-side flip down mounted onto the silicon photonics substrate 100. Particularly, through the silicon photonics tuning section and a waveguide-based wavelength locker, laser wavelength can be tuned to provide all ITU channels in C-band each with a sharp transmission spectrum for DWDM communication. More details can be found descriptions of FIG. 3 through FIG. 14 of the specification. Optionally, the laser light is outputted from the InP gain region coupled via an integrated coupler with a waveguide (formed in a same silicon photonics substrate 100). The waveguide delivers the laser light, which is used as a local oscillator source for the coherent receiver 3000 to detect incoming coherent light signals and is also served as a light source for producing I/Q modulated coherent signal to be transmitted by the coherent transmitter 2000.

Optionally, the integrated coherent optical transceiver includes multiple silicon waveguides respectively laid in the silicon photonics substrate 100, though they are not explicitly labeled in FIG. 1, for connecting several different silicon photonics components including power splitter, polarization beam splitter and rotator, polarization beam rotator and combiner, phase shifter, power attenuator, or part of optical modulator. Optionally, the silicon waveguides have regular rectangular wire shape with a fixed width and height. Optionally, the height is selected based on a usage of standard 220 nm silicon-on-insulator (SOI) substrate during its formation process. Optionally, the width of the silicon waveguide is about 300 nm to 500 nm. Optionally, the silicon waveguides have alternative shaped structures like rib structure with multiple steps in height, taper structure with varying widths along its length, or multiple branches of different widths and separations joined at different cross-section planes, depending on specific functional applications. Optionally, some of the silicon photonics components mentioned above are also silicon waveguides themselves monolithically formed in a same manufacture process for preparing the silicon photonics substrate 100 to integrate the coherent optical transceiver.

For ultrasmall silicon waveguides of a few hundred of nanometers in width (parallel to the substrate) and height (orthogonal to the substrate) used in compact silicon photonics modules, they often exhibit very strong polarization dependence for a transmitted light with infrared wavelength (typical for telecommunications) such that the transmission loss for a transverse electric (TE) mode polarization (parallel to the substrate) is much less than that for a transverse magnetic (TM) mode polarization (orthogonal to the substrate). Therefore, typical silicon photonics device works for TE mode only. Optionally, the output light of the tunable laser 1000 in a transverse electric (TE) mode polarization is split between the transmitter block 2000 and the receiver block 3000 with an optimized ratio. In the transmitter block 3000, the light coming from the tunable laser 1000 at a wavelength selected in a broadband by a tunable filter section is firstly split to a TE-mode light and a TM*-mode (still a TE-mode) light, both of which are performed an optical I/Q modulation. The TE-mode light becomes a TE-mode signal. The TM*-mode light is then performed a polarization rotation to form a transverse magnetic (TM) mode signal. The TE-mode signal and the TM-mode signal are then combined to become a coherent output signal of the transceiver at the selected wavelength. In the receiver block 3000, the optical signal (TE-mode) coming from the tunable laser 1000 acts as a local oscillator at the wavelength selected by the tunable filter section for detecting incoming coherent input signals.

Referring to FIG. 1, the output of the tunable laser 1000 is substantially a TE-mode laser light, which is firstly split by a power splitter 1001 to two parts, a first light and a second light respectively with a X:Y ratio. The first light is delivered to the coherent receiver block 3000 with X portion of the laser power and the second light is forwarded to the coherent transmitter block 2000 with Y portion of the laser light. The X:Y ratio is varied or optimized based on specific system operation condition. Optionally, X is set in a range from 10 to 50%. For the first light coupled into the coherent receiver block 3000, it is further split to two 50% portions, a third light and a fourth light, by a power splitter 3001. The third light is loaded into a TE 90° hybrid receiver 3200 and the fourth light is loaded into a TM* 90° hybrid receiver 3300, for respectively assisting detections of TE-mode/TM-mode signals of the incoming optical signal received by the coherent optical transceiver via an input port (Light in).

For the second light coupled into the coherent transmitter block 2000, it is used as an original light source to generate a coherent optical signal to be transmitted out of an output port. Optionally, the second light can be provided as a TE-mode polarized light and tuned to be at any wavelength in a broadband like C-band or O-band designated for telecommunication. In order to serve as a coherent light signal with mixed polarization modes, a TM-mode polarized part of the second light needs to be generated. Both TE- and TM-mode polarized parts are modulated by optical coherent modulators. Optionally, the optical coherent I/Q modulator based on delay-line interferometer in silicon or silicon nitride or similar material integrated in silicon photonics substrate has been developed with polarization compensation at selective wavelengths, e.g., as shown in U.S. Pat. No. 10,031,289, assigned to Inphi Corp.

As seen in FIG. 1, both the coherent transmitter block 2000 and the coherent receiver 3000 of the integrated coherent optical transceiver have a TE-mode path and a TM-mode path for providing or detecting a coherent light with mixed polarizations in the polarization-independent communication system. However, silicon photonics circuit including Si-based waveguide linear modulator operates essentially in a TE-mode only configuration. In order to handle the coherent optical signal with both TE mode and TM mode parts, the silicon-photonics based coherent transceiver needs at least 1) a Polarization Beam Rotator Combiner (PBRC) integrated with a polarization-independent semiconductor optical amplifier (SOA) at an output port (Light out) of the transmitter block to output a coherent optical signal having both TE and TM mode, and 2) a Polarization Beam Splitter Rotator (PBSR) to split TE-mode part and TM-mode part of the incoming coherent optical signal and rotate the TM-mode part to TE-mode before being coupled into optical hybrid detectors.

Conventional PBSR is either wavelength sensitive so that it is not suit for broadband operation or based on prism that is hard to be made in super compact size. A compact PBSR based on photonic integrated circuits (PICs) having combined features like compact size, high extinction ratio, low insertion loss, broadband range, stability, simple structure and high tolerances in manufacture has been developed, referring to U.S. Pat. No. 9,915,781 assigned to Inphi Corp. In particular, as shown in FIG. 2A, a waveguide-based polarization beam splitter-rotator is shown in its top view. The PBSR 16 includes a single piece of monolithically silicon planar waveguide including multiple shaped sections formed with a standard 220 nm silicon layer of a silicon-on-insulator (SOI) substrate. A first section is a converter in rib structure characterized, in both FIG. 2A and FIG. 2B, by a top-layer 1602 overlying a bottom-layer 1601 extended in the lengthwise direction through a first segment of a length $L_1$ from the input port 1600 to a joint plane AA' and a second segment of a length $L_2$ from the joint plane to the first cross-section plane 1610. The top-layer 1602 is narrower than the bottom-layer 1601 and both vary throughout the first length $L_1$ and throughout the second length $L_2$ except they have a first common width $W_0$ at the input port 1600 and a second common width $W_1$ at the first cross-section plane 1610. The specific length-width combination of both the top-layer 102 and the bottom-layer 1601 is configured to provide a polarization-mode conversion of TM-mode to TE-mode for a coherent light wave transmitted through, depending on wavelength ranges of the coherent optical signal.

The top-layer 1602 of a thickness of $h_t$ is formed overlying the bottom-layer 1601 of a thickness $h_b$ in an overlay process after the silicon layer of the thickness of $h=h_t+h_b=220$ nm over an oxide layer is patterned for the rib structure waveguide as part of a monolithic process of forming the PBSR 16. In a specific embodiment, the converter is configured for handling optical wave of broadband wavelengths, for example, 0-band in a range of 1270 nm to 1330 nm or C-band from about 1530 nm to about 1560 nm (with slightly different dimensions of the rib structure). In addition, the width Wt of the top-layer 1602 at the joint plane is made to be greater than the first common width $W_0$, the width $W_b$ of the bottom-layer 1601 at the joint plane is made to be greater than the width Wt of the top-layer 1602 but smaller than the second common width $W_1$, and the first length $L_1$ is made to be shorter than the second length $L_2$. After fine tuning the length-width combination (with a standard height of 220 nm) under the above configuration the rib structure waveguide serves a desired polarization mode converter. For an input light with mixed TM mode and TE mode inputted via the input port 1600, the TM mode is substantially converted to first-order Transverse Electric (TE1) mode and the TE mode is substantially converted to zero-order Transverse Electric (TE0) mode as the input light travels to the first cross-section plane 1610. Specifically, the TE1 mode includes two sub-modes, an out-of-phase $TE1_1$ sub-mode and an in-phase $TE1_2$ sub-mode. The TE0 mode just is a single-phase mode.

Referring to FIG. 2A, a second shaped section of the PBSR 16 includes a splitter 1612 directly coupled to the first cross-section plane of the converter as part of the monolithic planar silicon waveguide formed from the 220 nm silicon layer of the SOI substrate. FIG. 2C is a cross-section view of the waveguide-based PBSR 10 along BB' plane according to an embodiment of the present invention. Referring to FIG. 2C and FIG. 2A, the splitter 1612 is a planar waveguide having a height h of the 220 nm silicon layer extended in the lengthwise direction from the first cross-section plane 1610 to a second cross-section plane 1620. The first cross-section plane 1610 passes the input light transmitted through the converter. The second cross-section plane 1620 includes a first port 1701 and a second port 1702 respectively located next to two opposing edges and separated from each other by a gap $W_g$. In an embodiment, the splitter 1612 is designed for splitting the input light received at the first cross-section plane 1610 substantially evenly to a first wave at the first port 1701 and a second wave at the second port 1702.

Referring to FIG. 2A again, a third shaped section of the PBSR 16 includes a phase shifter waveguide coupled to or naturally extended from the first port 1701 and the second port 1702 at the second middle cross-section plane 1620. The phase shifter waveguide includes a first waveguide arm 121 coupled to the first port 1201 and a second waveguide arm 122 coupled to the second port 1202, both having the same height h of the 220 nm silicon layer. The first waveguide arm 1621 is extended in the lengthwise direction to a third port 1801 of a third cross-section plane 1630 and the second waveguide arm 1622 is separately extended in the lengthwise direction to a fourth port 1802 of the third cross-section plane 1630. In an embodiment, the first waveguide arm 1621 is configured to receive the first wave from the first port 1701 and to transmit the first wave through at least a length $L_6$ towards the third port 1801 while keeping the first wave at the third port 1801 in-phase relative to that at the first port 1701. The second waveguide arm 1622 is configured to receive the second wave from the second port 1702 and to transmit the second wave through a separate path of the same length $L_6$ towards the fourth port 1802 while adding a phase shift to the second wave at the fourth port 1802 relative to that at the second port 1702.

FIG. 2D is a cross-section view of the waveguide-based PBSR 16 of FIG. 2A along CC' plane according to an embodiment of the present invention. Referring to FIG. 2A and FIG. 2D, the first waveguide arm 1621 of the phase shifter includes a straight bar shape of at least the length $L_6$ and a first arm width $W_{1a}$ connected between the first port 1701 and the third port 1801, and the second waveguide arm 1622 of the phase shifter includes a straight bar shaped portion having at least the length $L_6$ joined aside with a triangle shaped portion connected between the second port 1702 and the fourth port 1802. The second waveguide arm 1622 has a varying second arm width $W_{2a}$ which increases from the first arm width $W_{1a}$ at one end to a maximum at an apex of the triangle shaped portion then decreasing again to the first arm width $W_{1a}$ at the other end. The constant width $W_{1a}$ associated with the length $L_6$ in the first waveguide arm 1621 effectively retains first wave in-phase travelling through the first waveguide arm 1621 to reach the third port 1801 at the third cross-section plane 1630. At the same time, the varying width $W_{2a}$ associated with the length $L_6$ in the second waveguide arm 1622 can be adjusted to provide a desired phase delay to the second wave traveling independently through the second waveguide arm 1622 to reach the fourth port 1802 at the third cross-section plane 1630. In a specific configuration, the maximum $W_{2a}$ is set to be slightly smaller than twice of the first arm width $W_{1a}$ and the length $L_6$ is no greater than 11 µm to cause a phase delay of $(1/2)\pi$ in the second wave through the second waveguide arm 1622. Alternatively, with lightly reduction in the maximum $W_{2a}$ and increase in the length $L_6$, a phase delay of $(3/2)\pi$ can be produced to the second wave through the second waveguide arm 1622. In principle, a phase shift of $(\pi/2+n\pi)$ can be generated for n being any integer though effective phase values are all limited within $2\pi$.

Referring to FIG. 2A again, a fourth shaped section of the PBSR 16 includes a 2×2 MMI coupler 1632 as a planar waveguide of the same height h of 220 nm silicon layer naturally extended from the third port 1801 and the fourth port 1802 at the third cross-section plane 1630 to an output plane 1640 with a first output port 1901 and a second output port 1902. From the input port 1600 to the fourth cross-section plane 1640, the PBSR 16 includes a total length less than 100 µm, thus forming a very compact sized device suitable for highly integrated silicon photonics communication system. The 2×2 MMI coupler 1632 is characterized by a rectangular shape of a length $L_7$ measured from the third cross-section plane 1630 to the output plane 1640 and a width $W_2$. The first output port 1401 is aligned with the third port 1801 in a bar position at a distance $W_p$ away from a central line of the rectangular shaped planar waveguide in the lengthwise direction. The first output port 1901 is in a cross position relative to the fourth port 1802. The second output port 1902 and the fourth port 1802 are respectively in mirror symmetric positions relative to the first output port 1901 and the third port 1801, nevertheless making the second output port 1902 to be in a cross-position relative to the third port 1801. The 2×2 MMI coupler 1632 in such configuration induces a general interference of optical waves coupled via both the third port 1801 and the fourth port 1802 and outputs a first output light in TE0 mode to the first output port 1901 and a second output light in TE0 mode to the second output port 1902. Depending on specific polarization modes and phase difference of the first wave at the third port 1801 and the second wave at the fourth port 1802, optionally, the first output light may be exclusively originated from the input light with TM mode and the second output light may be exclusively originated from the input light with TE mode. In other words, the PBSR 16, with a compact length less than 100 µm, is able to split the input light with mixed TM mode part and TE mode part, and to guide substantially TM mode part and rotate it to a TE0 mode outputted to a first output port, and guide substantially TE mode part and retain it as TE mode outputted to a second output port, realizing a polarization splitting/rotating function. And this function is applicable to broadband transmission with any wavelength in entire O-band or C-band.

Referring back to FIG. 1, for the coherent receiver block 3000 the incoming coherent light signal R has mixed TE/TM-mode parts in I/Q modulation. A PBSR 3100 is used to receive the incoming light signal R and, following the polarization splitting/rotating function described above, to output the TE-mode part signal $R_E$ to a first waveguide in TE polarization and the TM-mode part $R_M$ to a TM*-branch also in TE polarization, compatible for the silicon photonics chip that operates in the TE-mode only. The TE-mode part signal $R_E$ in the TE-branch is then loaded into a TE 90° hybrid receiver 3200 which also receives a local-oscillation (LO) signal A in TE-mode split from the tunable laser 1000 as a second input (FIG. 1). The TE 90° hybrid receiver 3200 produces four outputs: $\frac{1}{2}\times(R_E+A)$, $\frac{1}{2}\times(R_E-A)$, $\frac{1}{2}\times(R_E+jA)$, and $\frac{1}{2}\times(R_E-jA)$ through a perfect I/Q demodulation, into a trans-impendence amplifier (TIA) chip 3400 where these optical signals are converted to two current signals $I_I$ and $I_Q$ by balanced photodetectors. Further, the TIA chip includes analog-to-digital converter to convert the current signals into digital signals that can be processed in a digital signal processor (DSP) (not explicitly shown) and the TE-mode part signal of the incoming coherent light can be specifically detected. Similarly, the TE-mode part signal $R_M$ in the TM*-branch is loaded into a TM* 90° hybrid receiver 3300 which is also receives a LO signal A in TE-mode split from the tunable laser 1000 as a second input. Also, the outputs of the TM* 90° hybrid receiver 3300 are sent to the TIA chip 3400 where the TM-mode part signal of the incoming coherent light can be specifically detected via I/Q demodulation. Optionally, the TIA chip 3400 is a flip-chip mounted on the silicon photonics substrate 100 shared with the silicon photonics chip including the PBSR 3100 and power splitter 3001.

Referring to FIG. 1 again, the coherent transmitter block 2000 receives the Y portion light in TE-mode split from the tunable laser 1000 which is non-modulated and needs optical I/Q modulation for coherent communications. In the embodiment, the coherent transmitter block 2000 includes a driver chip 2600 configured to provide bias voltages and digital transmit electrical signals for an optical modulator to modulate the input light from the tunable laser 1000. The driver chip 2600 (e.g., including a serializer, a 4-level encoder, a 2-bit digital-to-analog converter) is provided in a flip-chip mounted on the same silicon photonics substrate 100. Optionally, the driver chip 2600 and the TIA chip 3400 can be integrated into a single chip. In the embodiment, a coherent I/Q modulator based on delay-line interferometer made by silicon or silicon nitride or similar material integrated in the silicon photonics chip that shares the same silicon photonics substrate 100 with the coherent receiver block 3000. The Y portion light in TE-mode from the tunable laser 1000 is split to a first input light in a TE Branch 2501 and a second input light in a TM* Branch 2502. Here the split of the Y portion light is done via a 50:50 power splitter (not explicitly shown) while retaining its TE polarization in either branch. Each of the first input light and the second input light is coupled into an I/Q modulator. In the embodiment, a first I/Q modulator is configured to have four linear waveguide arms with different phase delays to receive four equally split portions of the first input light by three power splitters in two stages. A first pair of arms form an in-phase (I) branch in Mach-Zehnder modulation configuration that produces a first output with in-phase modulation components for the first input light into the TE Branch 2501. A second pair of arms form a quadrature phase (Q) branch also in Mach-Zehnder modulation configuration plus a 90° phase shifter 2401 that generates a second output with quadrature phase modulation components for the first input light into the TE Branch 2501. As the first output and the second output are combined, a TE-mode output light with four-level I/Q modulation of the first input light is generated in a TE-output line 2503. Additionally, in the embodiment, a second I/Q modulator is configured, substantially the same as the first I/Q modulator, to have four linear waveguide arms with different phase delays to receive four equally split portions of the second input light into the TM* Branch 2502 by three power splitters in two stages. Similarly, a 90° phase shifter 2402 is used to combine the In-Phase and Quadrature components (I and Q) to generate a TM*-mode output light with four-level I/Q modulation of the second input light in a TM*-output line 2504. Note, this TM*-mode output light still a TE-mode light originated from the tunable laser 1000, even though it is labeled as TM*.

Since the output light in both TE-output line and TM*-output line is TE mode, a polarization beam rotator combiner (PBRC) to combine them at the output to form a coherent optical signal. Referring to FIG. 1, the coherent transmitter block 2000 also includes a PBRC 2200 to rotate the TE-mode light in the TM*-output line 2504 to a TM-mode light combining with the TE-mode light in the TE-output line 2503. Optionally, a TE attenuator 2301 and a TM* attenuator 2302 are two variable optical attenuators respectively inserted into the TE-output line 2503 and the TM*-output line 2504 to tune the polarization-dependent power loss in the two branches before the PBRC 2200. The output of the PBRC 2200 is a fully coherent optical signal with mixed TE/TM modes in I/Q modulation. The output is then fed to the polarization independent semiconductor optical amplifier (SOA) 2100 to boost optical power of the coherent optical signal being transmitted out of the coherent transceiver. Optionally, residual polarization dependent gain in the polarization independent SOA 2100 can also be tuned with the variable optical attenuators 2301 and 2302 in the TE and TM* paths. Optionally, the use of the polarization-independent SOA 2100 at the output of the coherent transmitter block 2000 allows for wide range of output power from the coherent optical transceiver no matter the polarization state of the optical signal. Optionally, the polarization-independent SOA 2100 is provided as a flip-chip mounted on the silicon photonics substrate 100. The flip-chip mounting of the SOA 2100 is similar to flip-chip integrations of the drive chip 2600 and the TIA chip 3400 with the silicon photonics substrate 100.

Optionally, the PBRC 2200 is substantially a same type of silicon-photonics device of the PBSR 3100 worked with reversed optical paths. In particular, referring to FIG. 2A, two TE-mode light waves, e.g., a TE-mode light with I/Q modulation and a TM*-mode light with I/Q modulation, are respectively loaded to two input ports 1901 and 1902 of the PBRC (which are two output ports for a PBSR). The TE-mode light loaded into the cross port 1901 is kept at the TE-mode at an output port 1600 of the PBRC (which is an input port for the PBSR), while the TM*-mode light (also a TE-mode light) loaded in a bar port 1902 is rotated by 90 degrees to become a true TM-mode polarization at the output port 1600.

Figure 3:
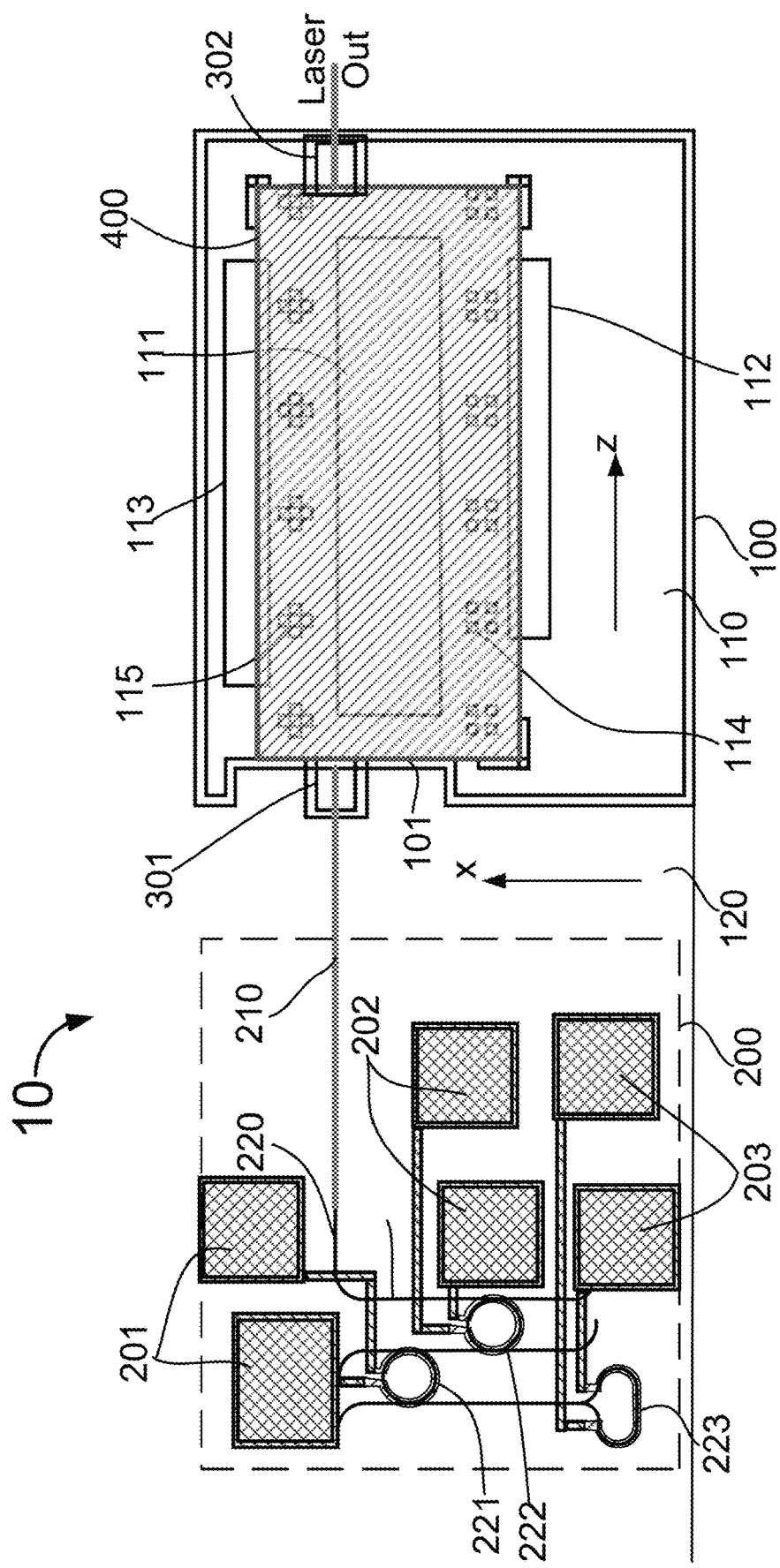
FIG. 3 is a simplified diagram of a silicon photonics tunable laser device according to an embodiment of the present invention.

FIG. 3 is a simplified diagram of a silicon photonics tunable laser device according to an embodiment of the present invention. This diagram is merely an example, which should not unduly limit the scope of the claims. One of ordinary skill in the art would recognize many variations, alternatives, and modifications. As shown, a silicon photonics tunable laser device 10 includes a laser diode flip-chip 400, a tunable filter 200, and integrated couplers 301 and 302, all of them being integrated into a single silicon photonics substrate 100. The silicon photonics substrate 100 includes a patterned region 110 pre-fabricated with one or more vertical stoppers 112 and 113, a plurality of alignment features 114, 115 substantially distributed along a first direction z, and a bond pad 111 laid substantially between the one or more vertical stoppers 112 and 113. The patterned region 110, optionally, is configured to be a flat surface region a step lower than a rest flat surface region 120 separated by an edge 101 substantially along a second direction x. The integrated coupler 301 is disposed next to the edge 101 to couple with the tunable filter 200 formed in the silicon photonics substrate 100 so that the wavelength tuning can be achieved through the tunable filter 200. The laser diode flip-chip 400 is configured to be attached into the patterned region 110 to bond with the bond pad 111 while rests against on the vertical stopper 112 and 113. At the same time, the step section along the edge 101 also acts as an edge stopper against an end of the laser diode chip 400. Eventually, laser light that has been tuned by the tunable filter 200 is outputted from an opposite facet of the laser diode chip 400. Referring to via FIG. 1 and FIG. 3, the integrated coupler 302 can be used to couple the laser output into a silicon wire waveguide in the same silicon photonics substrate 100 to deliver the laser light to either the receiver block 3000 and the transmitter block 2000.

In a specific embodiment, the tunable filter 200 is configured as a Vernier ring reflector filter. Optionally, the tunable filter 200 is a Si wire waveguide 220 fabricated in the silicon photonics substrate 100. Optionally, the tunable filter 200 is formed in the rest flat surface region 120 beyond the patterned region 110. The Si wire waveguide 220 includes at least two ring resonators 221 and 222. Optionally, the two ring resonators are made with slightly different radii. Optionally, a first ring 221 is coupled to a reflector ring 223 which is also made by a linear section of the Si wire waveguide coupled to a ring-like structure via a 1-to-2 splitter. Optionally, a second ring 222 is coupled to the integrated coupler 300 via a linear wire waveguide 210 made by different material. Optionally, the linear wire waveguide 210 is a SiN based waveguide formed in the same silicon photonics substrate 100.

In the embodiment, the tunable filter 200 further includes a first ring heater (Ring1_HTR) 201 having a thin-film resistive layer overlying the first ring 221, a second ring heater (Ring2_HTR) 222 having a resistive thin-film overlying the second ring 222, and a phase heater (Phase_HTR) 203 overlying the reflector ring 223. By changing temperature through changing voltages supplied to the two ring heaters (201 and 202), multiple resonate peak positions in transmission spectrum through each of the two ring resonators (221 and 222) can be tuned. Since the two rings have different radii, there is an offset between the two transmission spectra when they are superimposed (see FIG. 8). As they go through the reflector ring 223, a reflection light spectrum with a strong peak is produced (see FIG. 9) and tunable by changing temperature through changing voltage supplied to the phase heater (203). Optionally, each heater is made by a resistive thin film geometrically covering each ring-shaped wire waveguide and terminated with two bond pads for bonding to an external power supply.

Figure 10:
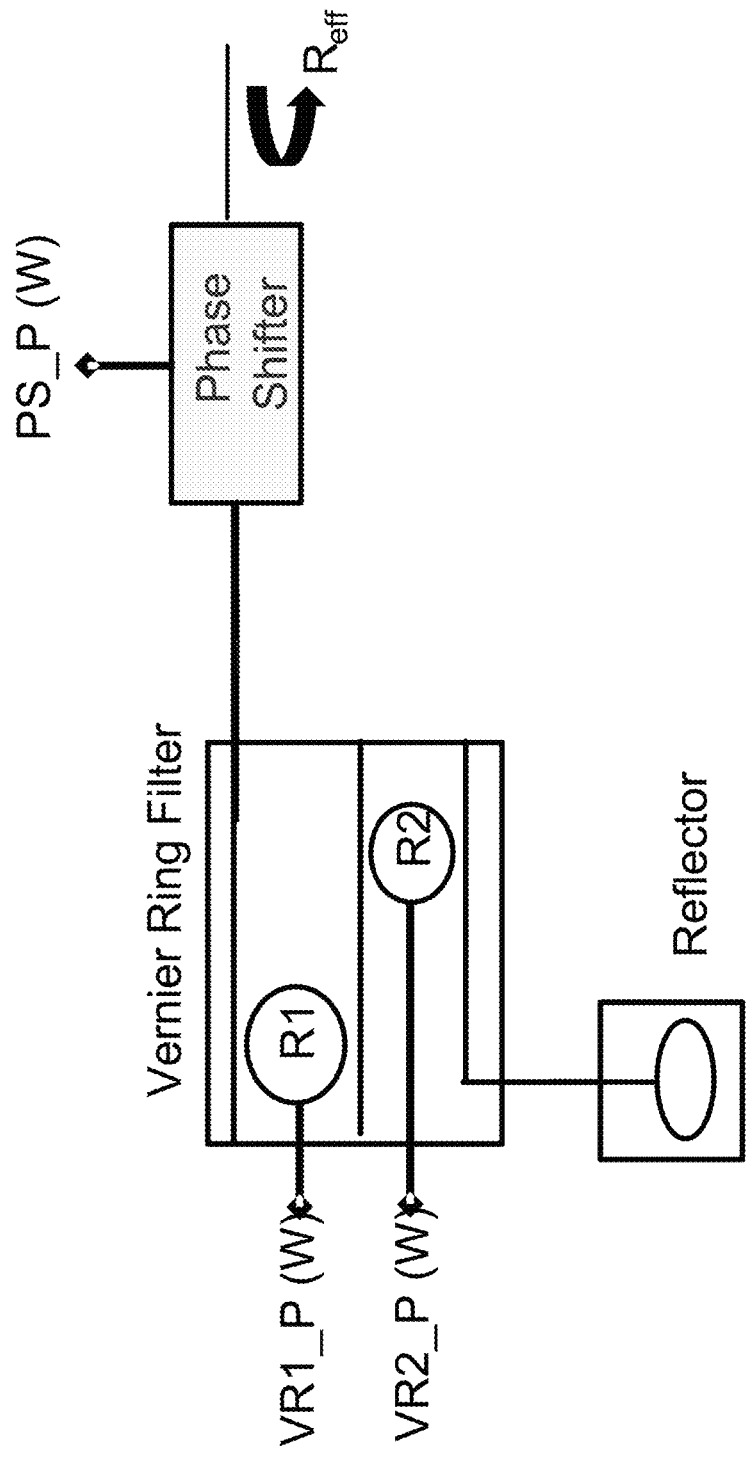
FIG. 10 is a simplified block diagram of the tunable filter including two ring resonators, a reflector, plus a phase shifter in a Vernier ring reflector configuration according to an embodiment of the present invention.

In the embodiment, the laser diode chip 400 includes a gain region. The gain region includes an InP-based active region that is driven to produce a laser light. The laser light, as it is initially generated from the InP active region, is inputted via the integrated coupler 301 and the linear wire waveguide 210 into the tunable filter 200. The light will pass through the at least two ring resonators 222 and 221 and reflected by the reflector 223 back to the gain region of the laser diode chip 400. The reflectivity spectrum, as shown in FIG. 10, yields a strong peak of a laser light at a wavelength. The wavelength is tunable in a wide band range at least from 1560 nm to 1530 nm shown in FIG. 10 by tuning the phase heater 203. The light is outputted as a laser light at a fixed wavelength when the round-trip cavity lasing condition is met if an integral of a whole light path of the tunable laser device 10 equals to $N2\pi$ (N is an integer).

Figure 4:
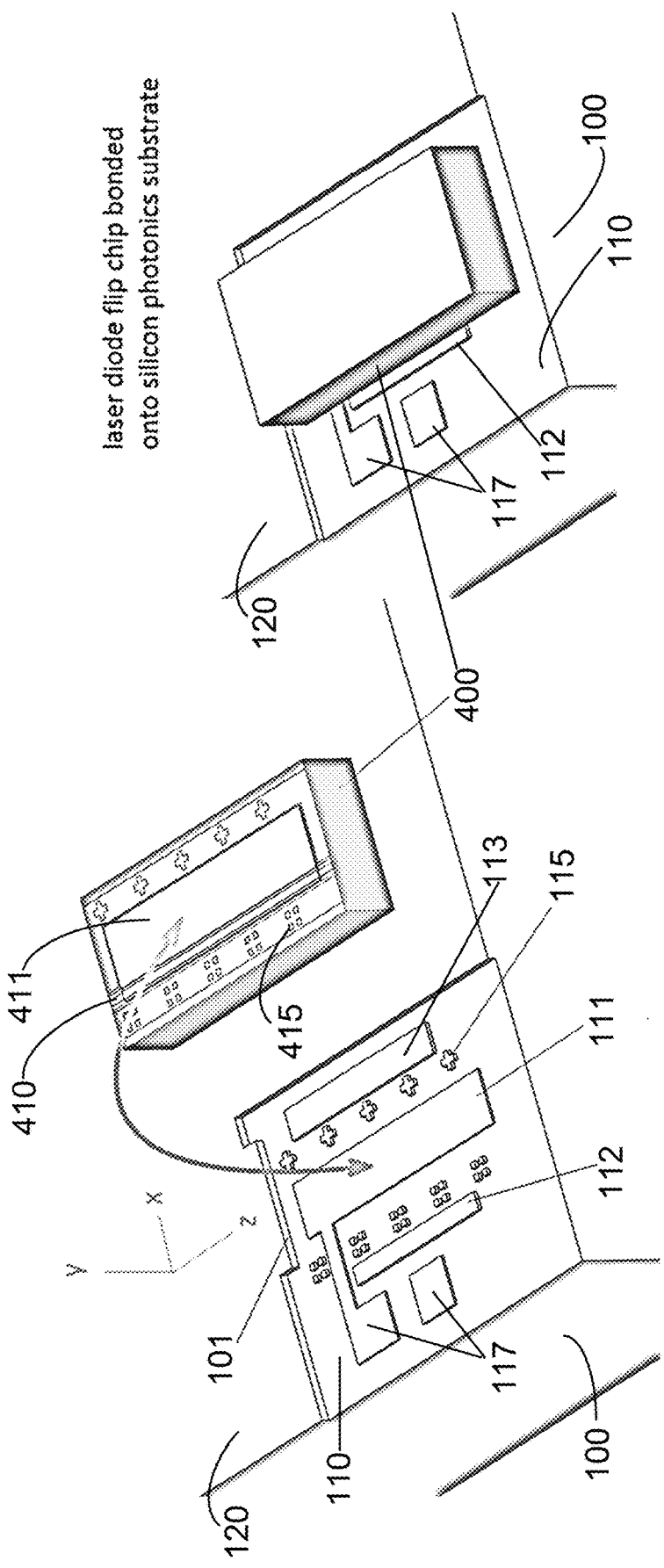
FIG. 4 is a schematic diagram showing a perspective view a laser diode chip flipped bonding to a silicon photonics substrate according to an embodiment of the present invention.

FIG. 4 is a schematic diagram showing a perspective view a laser diode chip flipped bonding to a silicon photonics substrate according to an embodiment of the present invention. This diagram is merely an example, which should not unduly limit the scope of the claims. One of ordinary skill in the art would recognize many variations, alternatives, and modifications. Referring to FIG. 4, a section of a substrate 100 is shown to include a patterned region 110 out of rest flat surface region 120. The patterned region 110 is configured to be a flat region being a step lower than rest flat surface region 120. Along one step an edge stopper 101 is formed facing a first direction z. Optionally, the step is along a second direction x perpendicular to the first direction z. On the patterned region 110, there is a bond pad 111 formed along the first direction z. On both sides of the bond pad 111, there are two vertical stoppers 112 and 113 which are two thin plates having certain heights. Two extended parts 117 of the bond pad 111 are used for bonding with an external source. Further along these vertical stoppers, a plurality of alignment features 115 are formed. Optionally, an alignment feature 115 includes multiple fiducials lined in one or two rows along the first direction z.

In the embodiment, a laser diode chip 400 can be prefabricated with a gain region 410 and a metallic electrode 411 formed on top in an elongated shape. The gain region 410 is formed from one edge to another of the chip. Optionally, the metallic electrode 411 is formed to be in contact with a P-side layer of an active region made by InP-based P-N junction quantum well structure. On two sides of the metallic electrode 411, an alignment feature 415 is formed on the laser diode chip and configured to match the plurality of fiducials of the alignment feature 115 on the patterned region 110. Referring to FIG. 4, the laser diode chip 400 is a flip chip bonded onto the patterned region 110 of the substrate 100. The configurations for both the patterned region 110 and the laser diode chip 400 allow the latter is rest against the vertical stoppers 112 and 113 of the former with one edge of the latter against the edge stopper 101 of the former as the alignment feature 415 of the latter is engaged with the plurality of fiducials 115 of the former.

Figure 5:
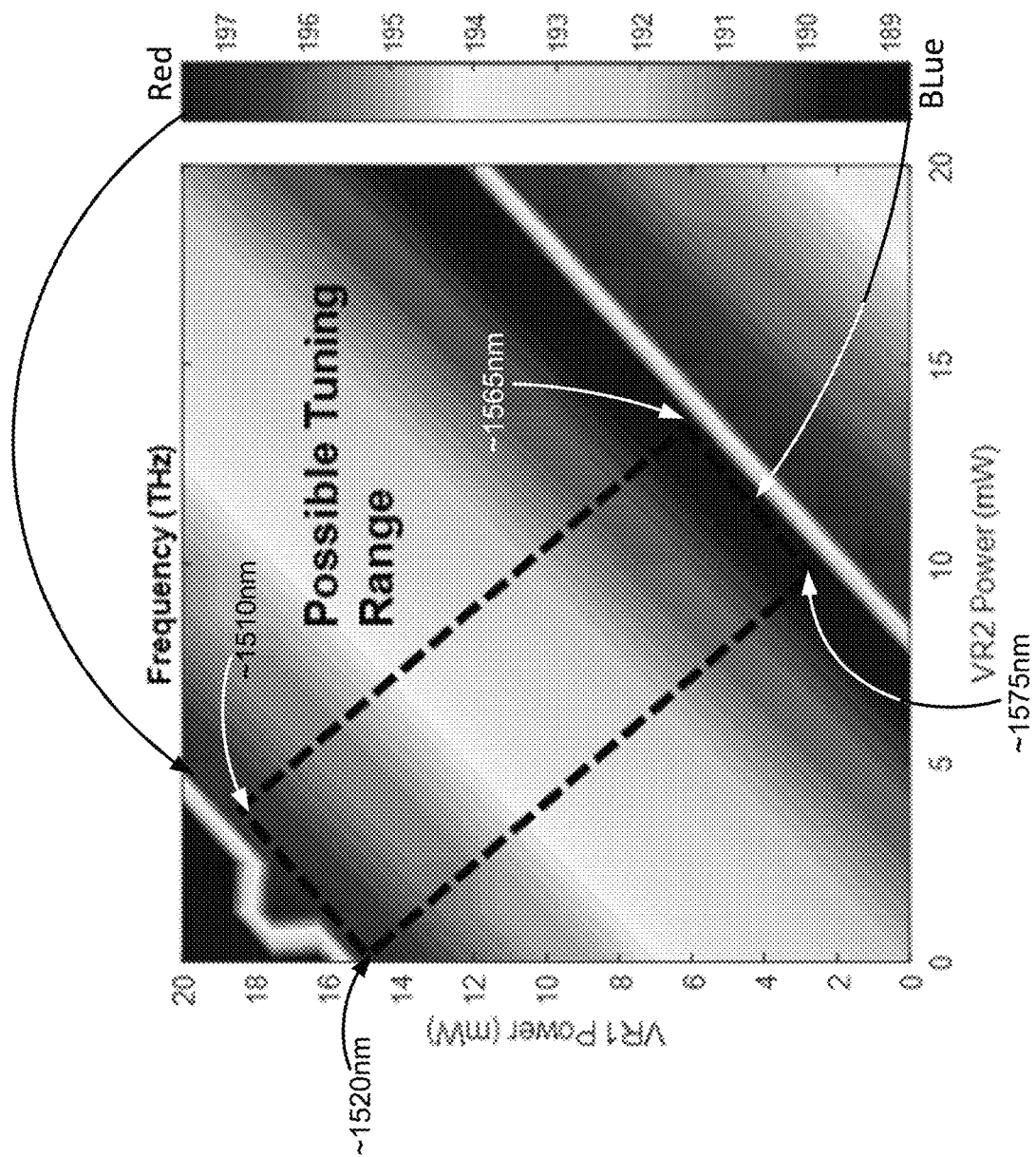
FIG. 5 is an exemplary diagram of a wavelength tuning map of a silicon photonics tunable laser according to an embodiment of the present invention.

FIG. 5 is an exemplary diagram of a wavelength tuning map of a silicon photonics tunable laser according to an embodiment of the present invention. This diagram is merely an example, which should not unduly limit the scope of the claims. One of ordinary skill in the art would recognize many variations, alternatives, and modifications. As shown, the diagram is plotted as spectrum frequency 2D map varied with powers supplied to two power supplies for the two ring heaters in the tunable filter mentioned above. The dashed rectangle gives a possible tuning range. As the two ring resonators are provided with different radii, it effectively yields an extended tunable range for the spectrum wavelength as the two transmission spectra are superimposed when the two ring resonators are physically coupled, for example, in a Vernier ring filter configuration (see FIG. 8). Optionally, the long side of the rectangle provides a relative rough tuning range of wavelength for more than 50 nm, e.g., from ~1520 nm to ~1575 nm, and the short side of the rectangle provides a relative finer tuning range of wavelength for ~10 nm, e.g., from ~1565 nm to ~1575 nm.

Figure 6:
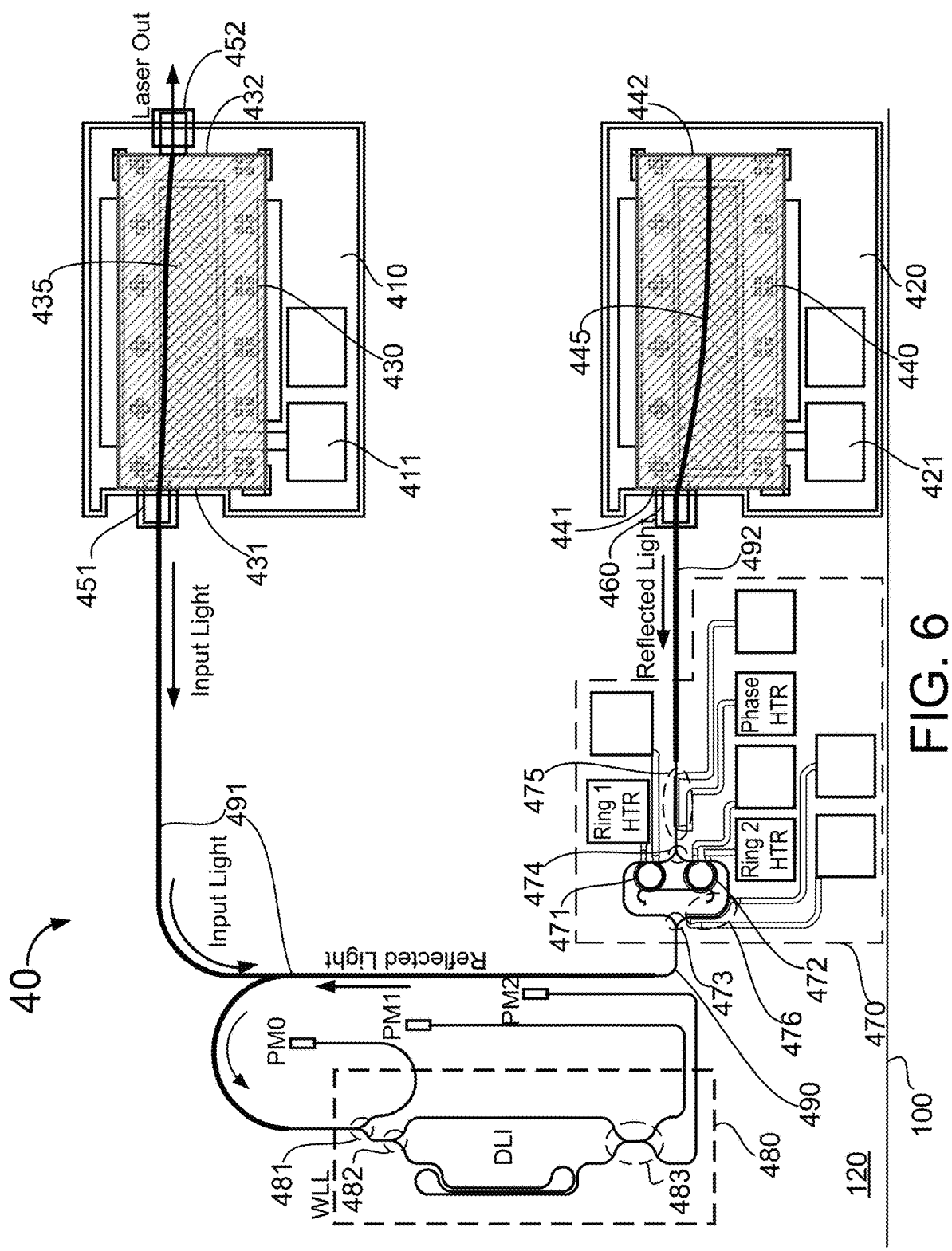
FIG. 6 is a simplified diagram of a silicon photonics tunable laser device according to another embodiment of the present invention.

FIG. 6 is a simplified diagram of a silicon photonics tunable laser device according to another embodiment of the present invention. This diagram is merely an example, which should not unduly limit the scope of the claims. One of ordinary skill in the art would recognize many variations, alternatives, and modifications. As shown, the tunable laser device 40 includes a first laser diode chip 430 bonded onto a first patterned region 410 of a substrate 100, a second laser diode chip 440 bonded onto a second patterned region 420 of the substrate 100, a tunable filter 470 coupled to a first gain region 435 of the first laser diode chip 430 via a first integrated coupler 451 and coupled to the second gain region 445 of the second laser diode chip 440 via a second integrated coupler 460, a wavelength locker 480 configured to lock the wavelength of a reflected light from the second gain region 445 through the tunable filter 470, and a laser output is realized at an end facet 432 of the first gain region 435 where a third integrated coupler 452 can be employed for coupling the laser output to a silicon wire waveguide. Referring to FIG. 1 and FIG. 6, the laser output from the tunable laser 1000 can be coupled via the integrated coupler 452 to a waveguide in the silicon photonics substrate 100 which further delivers to both the coherent receiver block 3000 and the coherent transmitter block 2000 via waveguide through a power splitter 1001.

Referring to FIG. 3 and FIG. 6, each of the first laser diode chip 430 and the second laser diode chip 440 of the tunable laser 40 is substantially configured to be same as one laser diode chip 400 that has a metallic electrode in contact with a P-type layer of corresponding active region and is flipped down to have the metallic electrode bonded with a bond pad of the first patterned region 410 and the second patterned region 420 in the same substrate 100. In particular, the first laser diode chip 430 is configured to be a cavity having a first end facet 431 and a second end facet 432 with the gain region 435 as a wire waveguide along an active region bounded between them. As the first laser diode is flipping (P-side down) bonded to the first patterned region 410, the first end facet 431 is against an edge stopper associated with the first patterned region 410 to be aligned with the first integrated coupler 451. The silicon wire waveguide associated with the first gain region 435 is configured to be in a curved shape with a non-perpendicular angle relative to each of the first end facet 431 and the second end facet 432 to reduce direct back reflection of the light by the corresponding end facet. Optionally, the first end facet 431 includes an anti-reflective coating. Optionally, the second end facet 432 is also coated with an anti-reflective coating for facilitating laser output. The first laser diode chip 430 is driven by a driver to generate a light as an input light into the tunable filter 470 via first waveguide 491. The second laser diode chip 440 is configured to be a cavity having a third end facet 441 and a fourth end facet 442 with the second gain region as a silicon wire waveguide along an active region bounded between them. As the second laser diode chip is flipping (P-side down) bonded to the second patterned region 420, the first end facet 441 is against an edge stopper associated with the second patterned region 420 to be aligned with the second integrated coupler 460. Optionally, the third end facet 441 is coated by an anti-reflective coating and the fourth end facet 442 is coated by high-reflective coating to enhance reflection of the input light. The reflected light can pass through the second integrated coupler 460 back to the tunable filter 470 via a second waveguide 492 so that the cavity of the second gain region 445, in addition to provide gain to the reflected light, acts also as a ring reflector of the tunable filter in substantially a Vernier ring reflector configuration.

In the embodiment, the tunable filter 470 of the tunable laser 40 is a Si wire waveguide fabricated in the substrate 100 particularly in a region 120 beyond the first patterned region 410 and the second patterned region 420. The tunable filter 470 includes two ring resonators, a first ring resonator 471 and a second ring resonator 472 coupled to each other. The two ring resonators are coupled to the first waveguide 491 via a 2-to-1 coupler 473 and coupled to the second waveguide 492 via another 2-to-1 coupler 474. Optionally, the 2-to-1 coupler is still in waveguide form with one port in one end and two ports in opposite end. Optionally, it is a splitter from one-port end to two-port end or a combiner from two-port end to the one-port end. Both the first waveguide 491 and the second waveguide 492 are fabricated in the region 120 of the substrate 100 to couple respective with the first integrated coupler 451 and the second integrated coupler 460. The first integrated coupler 451 is disposed next to the edge stopper associated with the first patterned region 410. The second integrated coupler 460 is disposed next to the edge stopper associated with the second patterned region 420. Optionally, each of the first waveguide 491 and the second waveguide 492 is made by SiN material embedded in a Si-based substrate 100. Optionally, the wire waveguide of the tunable filter 470 is made by Si material.

Referring to FIG. 4, the tunable filter 470 of the tunable laser 40 further includes a first heater (Ring1_HTR) having a resistive thin-film overlying the first ring resonator 471, a second heater (Ring2_HTR) having a resistive thin-film overlying the second ring resonator 472, a third heater (Phase_HTR) having a resistive thin-film overlying a phase shifter section 475 of the Si wire waveguide that is connected with the second waveguide 492. These heaters are configured to change temperature to cause a change of transmission spectrum of the light passing through respective ring resonators. Each transmission spectrum of the ring resonator has multiple resonate peaks (see FIG. 6). In an embodiment, the two ring resonators, 471 and 472, are provided with slightly different radii, then an offset between the two transmission spectra exists when they are superimposed (see FIG. 6). The first heater and the second heater can be controllably change temperatures of the respective first ring resonator and the second ring resonator to cause respective resonate peaks to shift to provide an extended tunable range of the wavelengths of those resonate peaks. After the input light passing through the tunable filter 470 is reflected back by the cavity of the second gain region 445, a reflectivity spectrum gives a stronger central peak (see FIG. 9), which is further tunable by changing temperature of the phase shifter section 475 using the third heater. In this case, the second gain region 445 acts as a ring reflector as the tunable filter 470 is configured to be a Vernier ring reflector while the phase shifter section 475 is formed next to the reflector instead of separated from the reflector as shown in FIG. 10.

Optionally, the tunable filter 470 of the tunable laser 40 includes a fourth heater having a resistive thin-film overlying a section of one branch of the 1-to-2 coupler 473 for finely balance power of input light split from the first waveguide 491 into the two branches respectively coupled to two ring resonators 471 and 472.

In the embodiment, the wavelength locker 480 is configured to be a delay line interferometer (DLI) based on Si waveguide formed in the substrate 100. Optionally, the wavelength locker 480 includes an input port coupled via a splitter to the first waveguide 491 to receive the reflected light from the tunable filter 470. Optionally, one end of the input port is a SiN waveguide coupled to the first waveguide 491 which is also made by SiN material. Another end of the input port connects to a 1-to-2 splitter 481 to guide one part of the light into a monitor port PM0 and another part of the light into the DLI via another 1-to-2 splitter 482. The light then comes out of the DLI via a 2-to-2 splitter 483 to a first interference output port PM1 and a second interference output port PM2. In the embodiment, the wavelength locker 480 is pre-calibrated to set the DLI for locking the wavelength (of the reflected light from the tunable filter) to certain channel wavelengths of a wide band. Optionally, the channel wavelengths supplied by the tunable laser 40 are ITU channels in C-band for DWDM application. Of course, the disclosure of the tunable laser 40 can be applied to O-band light source for CWDM application. Optionally, the tunable laser 40 is integrated in a coherent transceiver a coherent receiver block and a coherent transmitter block substantially on a same silicon photonics substrate (see FIG. 1). Optionally, each of the monitor port PM0, the first interference output port PM1, and the second interference output port PM2 is terminated with a photodiode for measuring light power in terms of photocurrent. A differential signal characterized by a photocurrent difference between PM1 and PM2 over the sum of them is collected to be an error signal fed back to drivers for the first laser diode chip and the second laser diode chip to adjust wavelength of light. Ideally, when the wavelength is adjusted or locked to a desired ITU channel pre-calibrated for the wavelength locker, the error signal should be zero, i.e., PM1=PM2.

Figure 7:
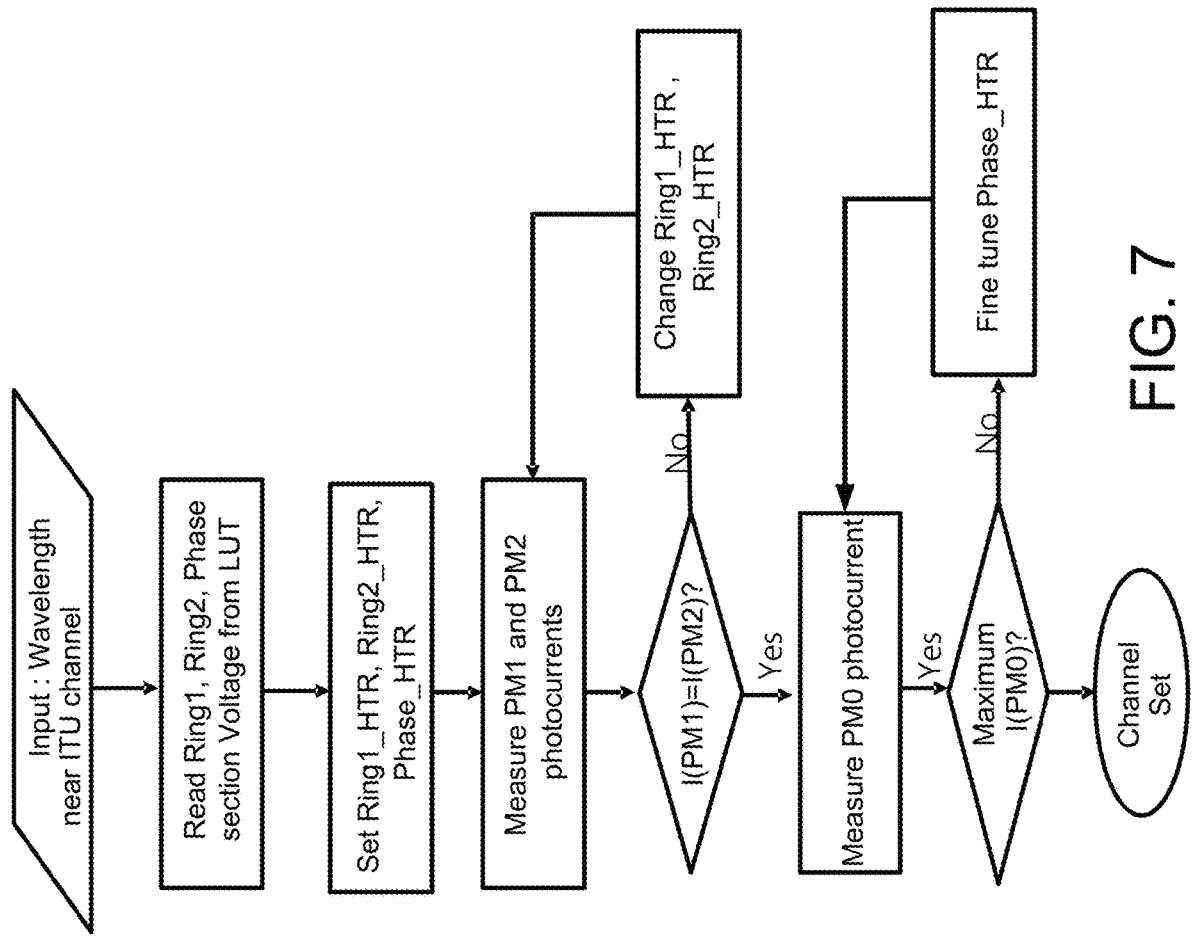
FIG. 7 is a flowchart of a method for tuning wavelength of a laser output of the silicon photonics tunable laser device according to an embodiment of the present invention.

In another aspect, the present disclosure also provides a method for tuning wavelengths of a silicon photonics based tunable laser device described hereabove. FIG. 7 is a flowchart of a method for tuning wavelength of a laser output of the silicon photonics tunable laser device according to an embodiment of the present invention. As shown, the method includes a step of generating a light with a wavelength near ITU channels (for example, in C-band) in a dual-gain configuration including a first active region and a second active region. Referring back to FIG. 6, in a specific embodiment, a first laser diode chip having a first metallic electrode in contact with a P-type layer of the first active region is provided and a second laser diode chip having a second metallic electrode in contact with a P-type layer of the second active region is provided. Further, the first laser diode chip to have the first metallic electrode is flipping bonded with a bond pad in a first patterned region of a substrate to align the first active region to a first integrated coupler and the second laser diode chip to have the second metallic electrode is flipping bonded with a bond pad in a second patterned region of the substrate to align the second active region to a second integrated coupler. The first active region and the second active region is connected via the silicon photonics tunable filter to form a combined resonate cavity. Referring to FIG. 7, the method includes driving the first laser chip and the second laser diode chip to generate the light in the combined resonate cavity. In particular, the method includes a step of inputting the light with gain from a first active region of a first laser diode chip driven by its driver. The input light with gain from the first active region is coupled into a first integrated coupler into the first waveguide which guides the input light to the silicon photonics based tunable filter. Additionally, the input light from the first active region passes through the first integrated coupler via a first waveguide into the tunable filter and it further passes via a second waveguide and through the second integrated coupler into the second active region and reflected with additional gain therefrom, achieving dual gains through the round-trip path of the combined resonate cavity.

Referring to FIG. 7, the method further includes reflecting the light with additional gain from a second active region of a second laser diode chip. The reflected light with additional gain from the second active region further passes through the second integrated coupler and back to the tunable filter via a second waveguide.

Additionally, the tunable filter is configured to have a first ring resonator Ring1, a second ring resonator Ring2, and a Phase shifter section. The method further includes a step of setting respectively a first heater associated with the first ring resonator, a second heater associated with the second ring resonator, and a third heater associated with the phase shifter to set the wavelength near an ITU channel. Respectively, the first heater, the second heater, and the third heater are configured to be resistive thin-films formed in the substrate to cover at least partially the first ring resonator Ring1, the second ring resonator Ring2, and the Phase shifter section. Each of these heaters can be controlled by voltages applied to two coupling electrodes from an external power supply. In a specific embodiment, the step includes reading voltages respectively set from the first heater, the second heater, and the third heater from a preset look-up-table (LUT). The voltages read from the LUT are substantially correlated with the corresponding ITU channel. For example, some specific voltage values are preset for wavelength at 1535 nm in C-band. Further, the step includes applying voltages read from the LUT respectively to the first heater and the second heater to respectively set two transmission spectra of the first ring resonator and the second ring resonator to obtain a synthesized spectrum with a strong peak wavelength in an extended tunable range. For example, the extended tunable range can be varied from 1520 nm to 1570 nm. In another example, when the gain profile is relatively limited, the extended tunable range can be at least varied from 1535 nm to 1565 nm. Furthermore, the step includes applying a voltage read from the LUT to the third heater to set a phase of a reflectivity spectrum with the strong peak wavelength in the extended tunable range. The reflection spectrum is set substantially based on the synthesized spectrum.

Referring to FIG. 7, the method further includes monitoring photocurrents at a monitor port split from the input port, a first interference output port, and a second interference output port of the wavelength locker (see FIG. 6) based on the light reflected from the second active region and filtered by the tunable filter. Each of the monitor port, the first interference output port, and the second interference output port is respectively terminated with a photodiode (such as PM0, PM1, and PM2, see FIG. 6). Each of these photodiodes generates a photocurrent as a measurement of the light power thereof, which can be monitored in real time. An error signal based on a differential light power between the first interference output port and the second interference output port can be used as a feedback for tuning light wavelength to be locked to a pre-calibrated wavelength, e.g., an ITU channel.

Furthermore, the method includes tuning the first heater and the second heater to coarsely tune the transmission spectrum through each of the first ring resonator and the second ring resonator until the photocurrents at the first interference output port and the second interference output port are equal. Since slightly different radii are assigned for the first ring resonator and the second resonator, an offset exists between the two transmission spectra. A synthesized spectrum can be obtained by superimposed the two transmission spectra, which includes at least one strong peak as two transmission peaks of two ring resonators are falling to a same wavelength. By tuning both the first heater and the second heater, the position of this strong peak in the synthesized spectrum is shifted in the extended tunable range. When the photocurrents at the first interference output port and the second interference output port are equal, it means the peak wavelength is substantially tuned to match a pre-calibrated wavelength locked by the wavelength locker as the error signal becomes zero. Of course, the wavelength locker 480 can be configured to in different manners for achieving the wavelength locking function in combination with the tunable filter 470 configured as a Vernier ring reflector. Many of the different silicon-photonics-based wavelength locker configurations can be referred to a U.S. Pat. No. 10,056,733 commonly assigned to Inphi Corporation.

The method further includes tuning the third heater to finely tune reflection spectrum by maximizing the photocurrent of the monitor port of the wavelength locker representing a maximum gain from a round trip cavity lasing condition associated with both the first active region and the second active region. The Phase shifter section of the tunable filter is located at a straight section of Si wire waveguide outside the two ring resonators. When the third heater, which is placed at least partially over the Phase shifter section, is tuned to change temperature of the Phase shift section, a phase of the reflected light can be tuned in accordance with the whole round-trip path of the light between the first active region and the second active region. The lasing condition is a maximum gain obtained under the physical setup of the optical path between the first active region and the second active region and phase optimized by the Phase shift section, which is characterized by the maximum power measured by photocurrent at the monitor port of the wavelength locker. The enlarged cavity with two active regions over a single active region certainly enhances lasing power of the tunable laser device.

Figure 8:
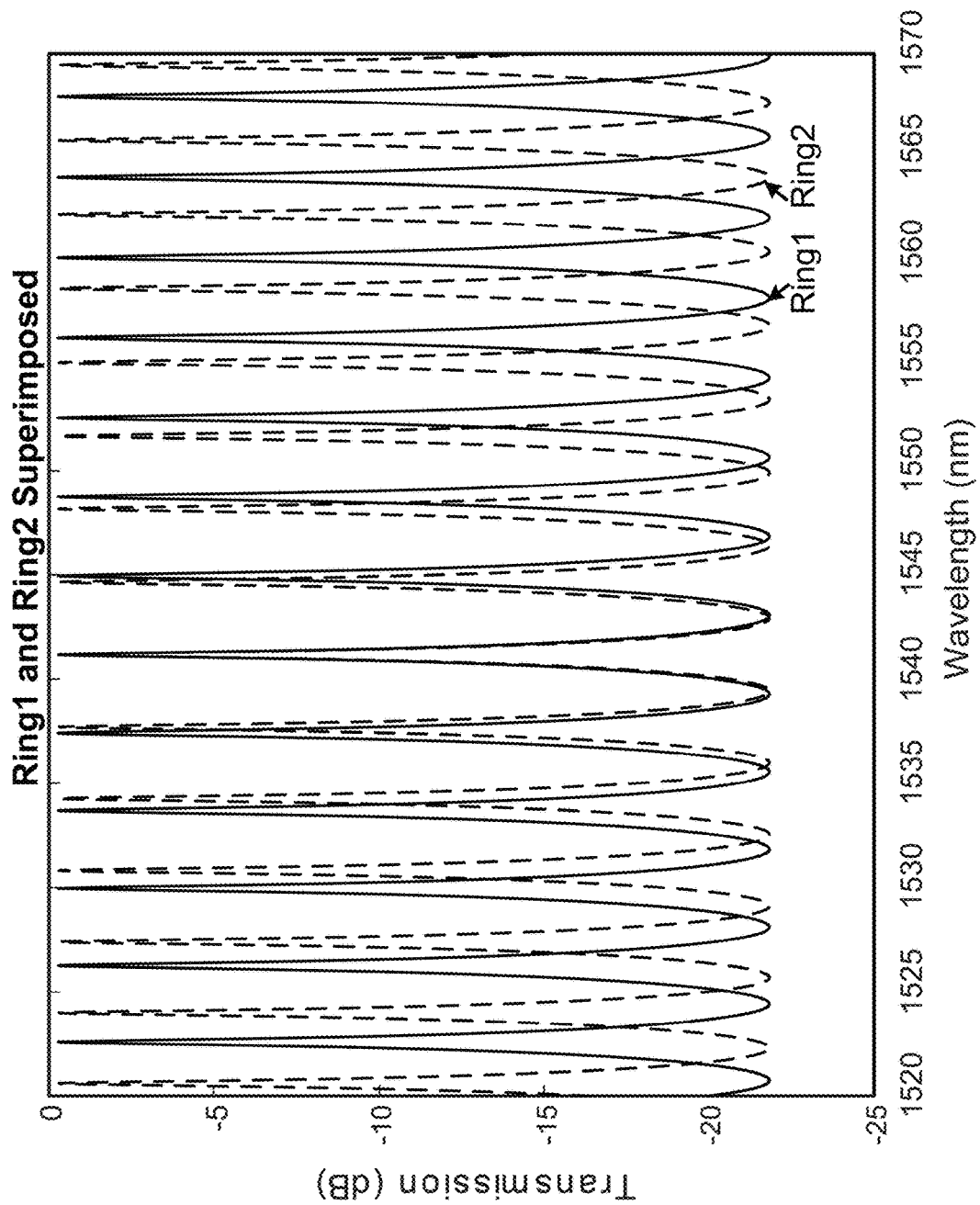
FIG. 8 is an exemplary diagram of two superimposed transmission spectra of respective two ring resonators with different radii of a tunable filter in the silicon photonics tunable laser device according to an embodiment of the present invention.

FIG. 8 is an exemplary diagram of two superimposed transmission spectra of respective two ring resonators with different radii of a tunable filter in the silicon photonics tunable laser device according to an embodiment of the present invention. This diagram is merely an example, which should not unduly limit the scope of the claims. One of ordinary skill in the art would recognize many variations, alternatives, and modifications. As shown, each transmission spectrum of a ring resonator contains multiple peaks with a certain spacing depended on the radius of the ring. Since, two different radii are provided for Ring1 and Ring2, which results in two different spectra-free-ranges (SFRs), there is an offset between the two transmission spectra. Yet, two specific peaks respectively from the two transmission spectra may fall to a substantially common wavelength, for example, ~1540 nm.

Figure 9:
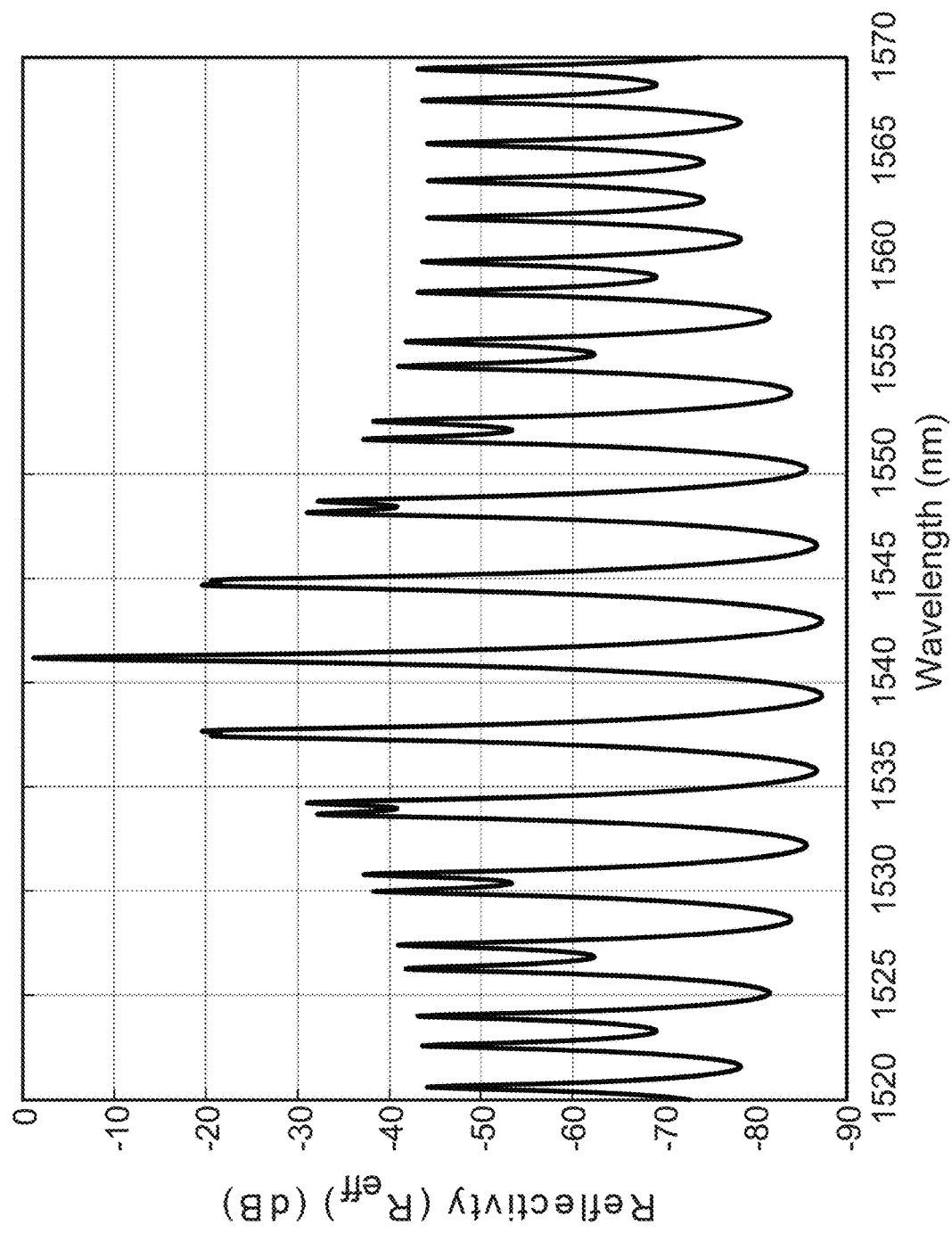
FIG. 9 is an exemplary diagram of a reflectivity spectrum of a reflector coupled to the two ring resonators of the tunable filter according to the embodiment of the present invention.

FIG. 9 is an exemplary diagram of a reflectivity spectrum of a reflector coupled to the two ring resonators of the tunable filter according to the embodiment of the present invention. This diagram is merely an example, which should not unduly limit the scope of the claims. One of ordinary skill in the art would recognize many variations, alternatives, and modifications. After the two transmission spectra are superimposed as light passing the two ring resonators is recombined in the single straight section of the wire waveguide and reflected from the second active region, a reflection spectrum is obtained which is substantially based on a synthesized spectrum of the two transmission spectra. As shown, the reflection spectrum is characterized by at least one strong peak at a wavelength, e.g., ~1540 nm.

FIG. 10 a simplified block diagram of the tunable filter including two ring resonators, a reflector, plus a phase shifter in a Vernier ring reflector configuration according to an embodiment of the present invention. This diagram is merely an example, which should not unduly limit the scope of the claims. One of ordinary skill in the art would recognize many variations, alternatives, and modifications. As shown, the tunable filter includes three sections: two ring resonators and phase control sections. The two ring resonators have slightly different FSRs, which allows for extension of the tuning range to the lowest common multiple of the FSRs through the Vernier effect. One phase control section is a loop reflector formed by a loop waveguide and a directional coupler. Optionally, the loop reflector can be replaced by a cavity facet of another laser diode chip. Another phase control section can be simply a section of waveguide with an added heater for directly tuning phase based on thermal optical effect. A reflection spectrum is substantially a synthesized spectrum obtained by superimposing two ring spectra. External laser cavity is configured between the facet of the (first laser diode chip) active region and a loop reflector. When the peaks of the transmission spectrum through the rings are identical and the phase is adjusted on the peak of the rings, lasing operation is occurred. Of course, there are multiple variations of the tunable filter configuration in terms of a setup of the ring resonators and phase control sections, resulting different synthesized spectrum.

Figure 11:
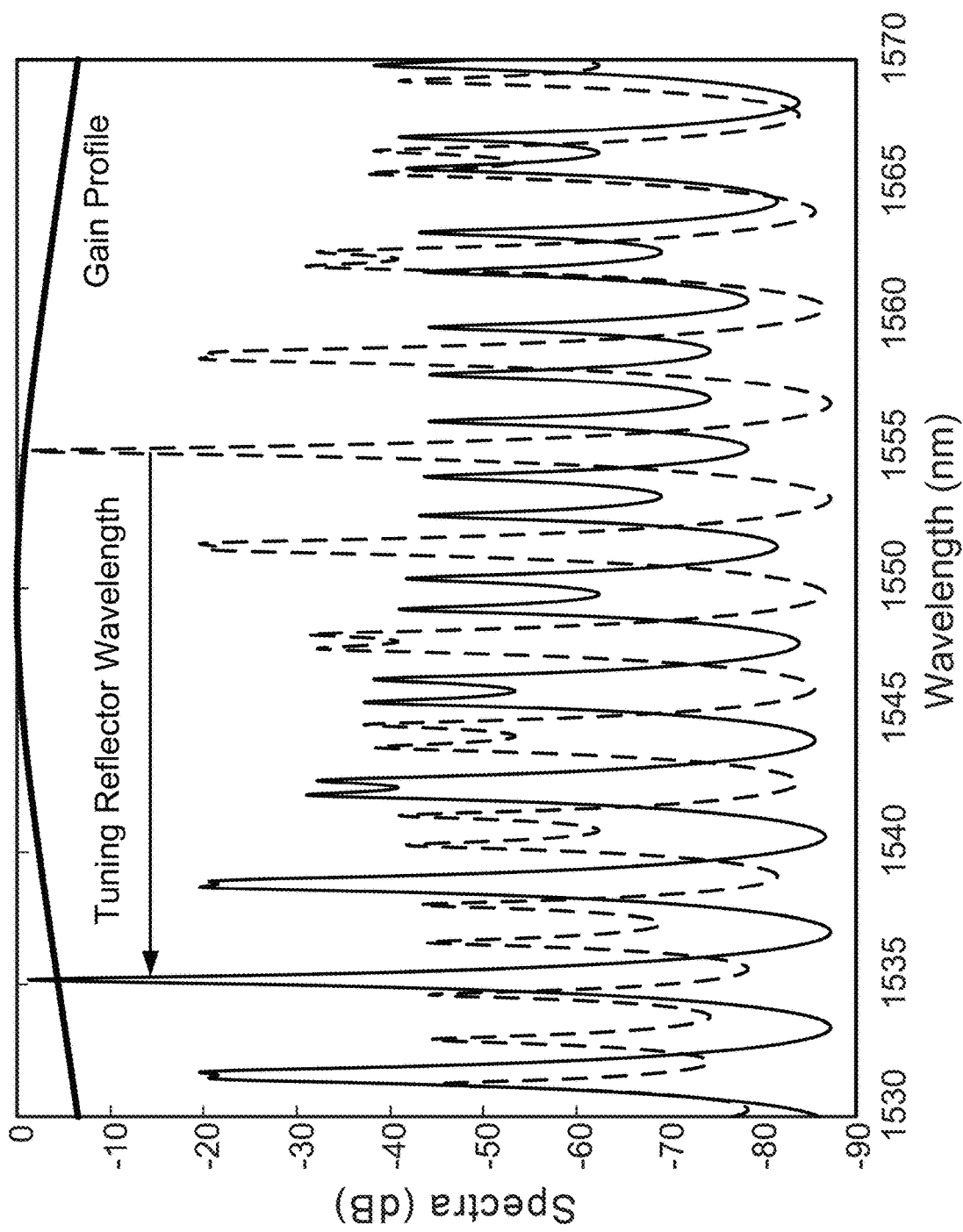
FIG. 11 is an exemplary diagram of two synthesized spectra respectively corresponding to wavelengths being tuned from 1555 nm to 1535 nm by tuning the tunable filter in Vernier ring reflector configuration and corresponding gain profile from 1530 nm to 1570 nm according to the embodiment of the present invention.

FIG. 11 is an exemplary diagram of two synthesized spectra respectively corresponding to wavelengths being tuned from 1555 nm to 1535 nm by tuning the tunable filter in Vernier ring reflector configuration and corresponding gain profile from 1530 nm to 1570 nm according to the embodiment of the present invention. This diagram is merely an example, which should not unduly limit the scope of the claims. One of ordinary skill in the art would recognize many variations, alternatives, and modifications. As shown, the synthesized spectrum is characterized by a strong peak due to superimposing two transmission spectra with common multiple peak wavelengths for different SFRs. The peak position, or wavelength value, can be tuned by tuning the Vernier ring reflector around an optimal central position in an extended tunable range.

Figure 12:
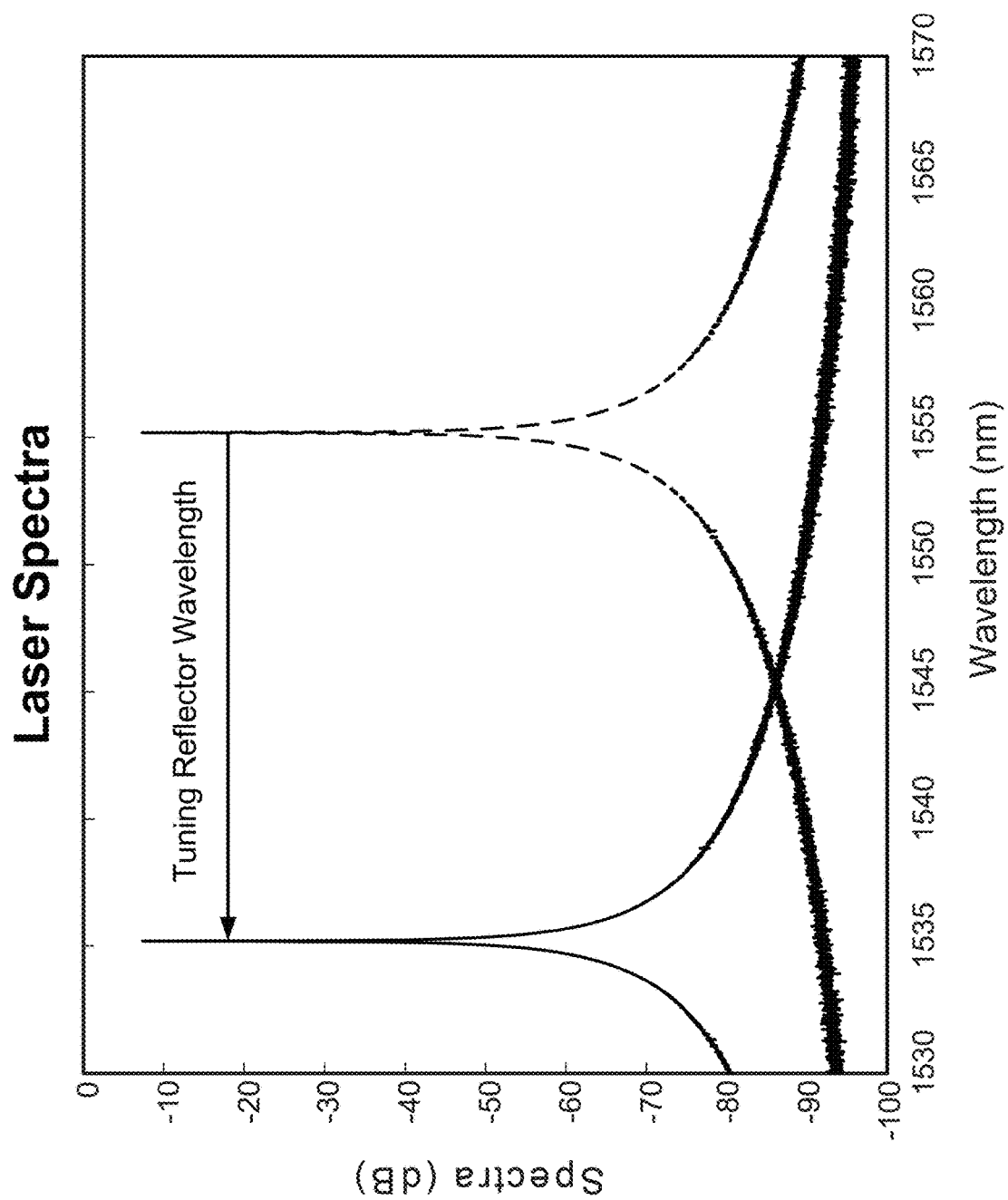
FIG. 12 is an exemplary diagram of laser spectra outputted by the silicon photonics tunable laser device with laser wavelength being tuned from 1555 nm to 1535 nm according to an embodiment of the present invention.

FIG. 12 is an exemplary diagram of laser spectra outputted by the silicon photonics tunable laser device with laser wavelength being tuned from 1555 nm to 1535 nm according to an embodiment of the present invention. This diagram is merely an example, which should not unduly limit the scope of the claims. One of ordinary skill in the art would recognize many variations, alternatives, and modifications. As shown, the laser wavelength is indicated by the peak of the spectra, which can become tunable across C-band (or other wide band) by tuning the Vernier ring reflector response. In the example, the laser wavelength is tuned from 1555 nm to 1535 nm. The tunable filter based on Vernier ring reflector configuration acts as wavelength selective filter for the gain profile. The center or optima position of the gain profile can be initially preset by setting the optimal temperatures using pre-calibrated voltages supplied to the resistive heaters associated with the Ring1, Ring2, and Phase shift section. For example, the pre-calibrated voltages can be stored in a look-up-table of a memory, which can be read every time for initialing the silicon photonics based tunable laser device. Coarse wavelength tuning can be achieved by changing temperatures around the Ring1 and the Ring2 to tune the wavelength in an extended tunable range around the optimal gain profile position set by the initial settings of the heaters associated with the Ring1, Ring2, and the Phase shift section. Fine wavelength tuning can be done by changing temperature around the Phase shift section. The laser regions also have a wavelength dependent gain profile which is much wider than those from the rings.

Figure 13:
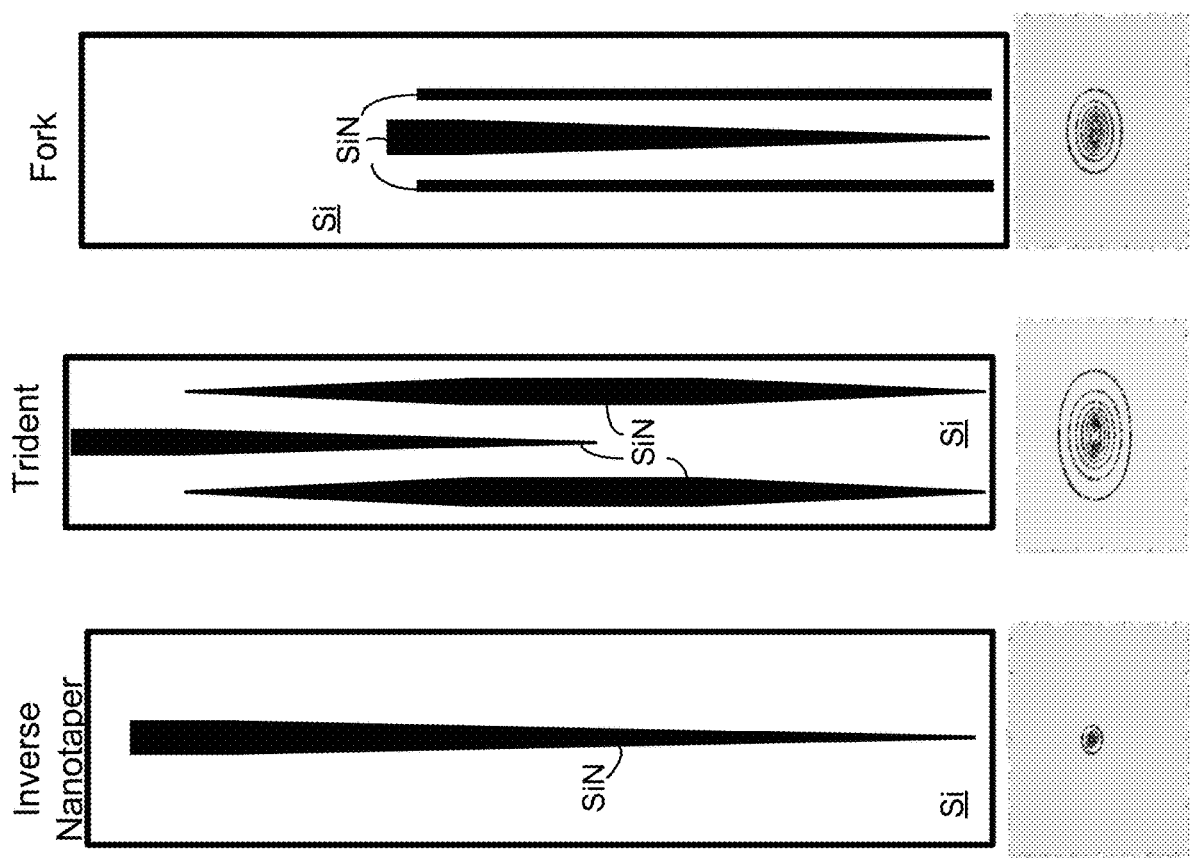
FIG. 13 is a schematic diagram of three types of an integrated coupler based on SiN in Si waveguide according to some embodiments of the present invention.

FIG. 13 is a schematic diagram of three types of an integrated coupler based on SiN in Si waveguide according to some embodiments of the present invention. This diagram is merely an example, which should not unduly limit the scope of the claims. One of ordinary skill in the art would recognize many variations, alternatives, and modifications. Like the FSRs, the coupling coefficients of the tunable filter with two ring resonators are important parameters in order to achieve large modal gain-difference for obtaining enough high side-mode suppression ratio to other modes. One key factor to determine the coupling coefficient is the alignment of light mode confined in the integrated coupler with the incoming laser light beam. On the other hand, tolerance to misalignment existed with different integrated coupler designs would be an advantage for enhance productivity of the tunable laser device.

Referring to FIG. 13, a first type of integrated coupler design is an Inverse Nanotaper structure made by SiN material embedded in a Si waveguide with a sharp needle pointing toward a waveguide end. A small mode diameter is shown for this design, giving large coupling loss in response to a relatively small misalignment. A second type of integrated coupler design is a Trident structure made by SiN material embedded in a Si waveguide. The SiN Trident structure includes a SiN nanotaper sandwiched in partial length laterally by two SiN symmetrical nanotapers that are extended up to the waveguide end of the coupler. A large mode diameter for this design is shown, giving lower coupling loss induced by misalignment. A third type of integrated coupler design is a Fork structure made by SiN material embedded in a Si waveguide. The Fork structure includes a SiN nanotaper sandwiched in full length laterally by two SiN linear stripes up to the waveguide end. It has a medium sized mode diameter yet giving a smallest coupling loss especially for smaller misalignment between the light mode and the laser spot.

Figure 14A:
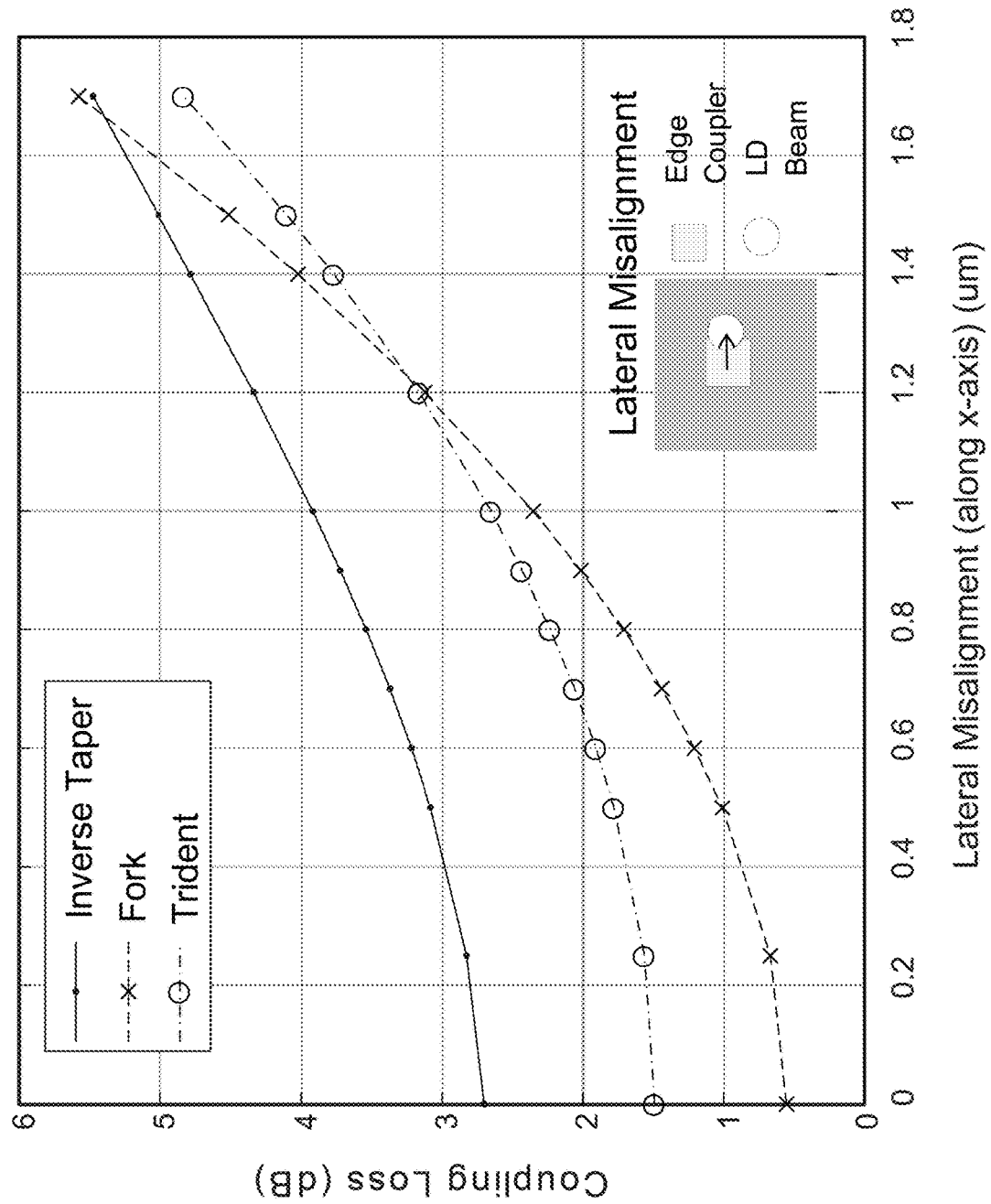
FIG. 14A is an exemplary diagram of a relationship between coupling loss and a lateral misalignment for an integrated coupler coupled between the tunable filter and a laser diode chip according to an embodiment of the present invention.
Figure 14B:
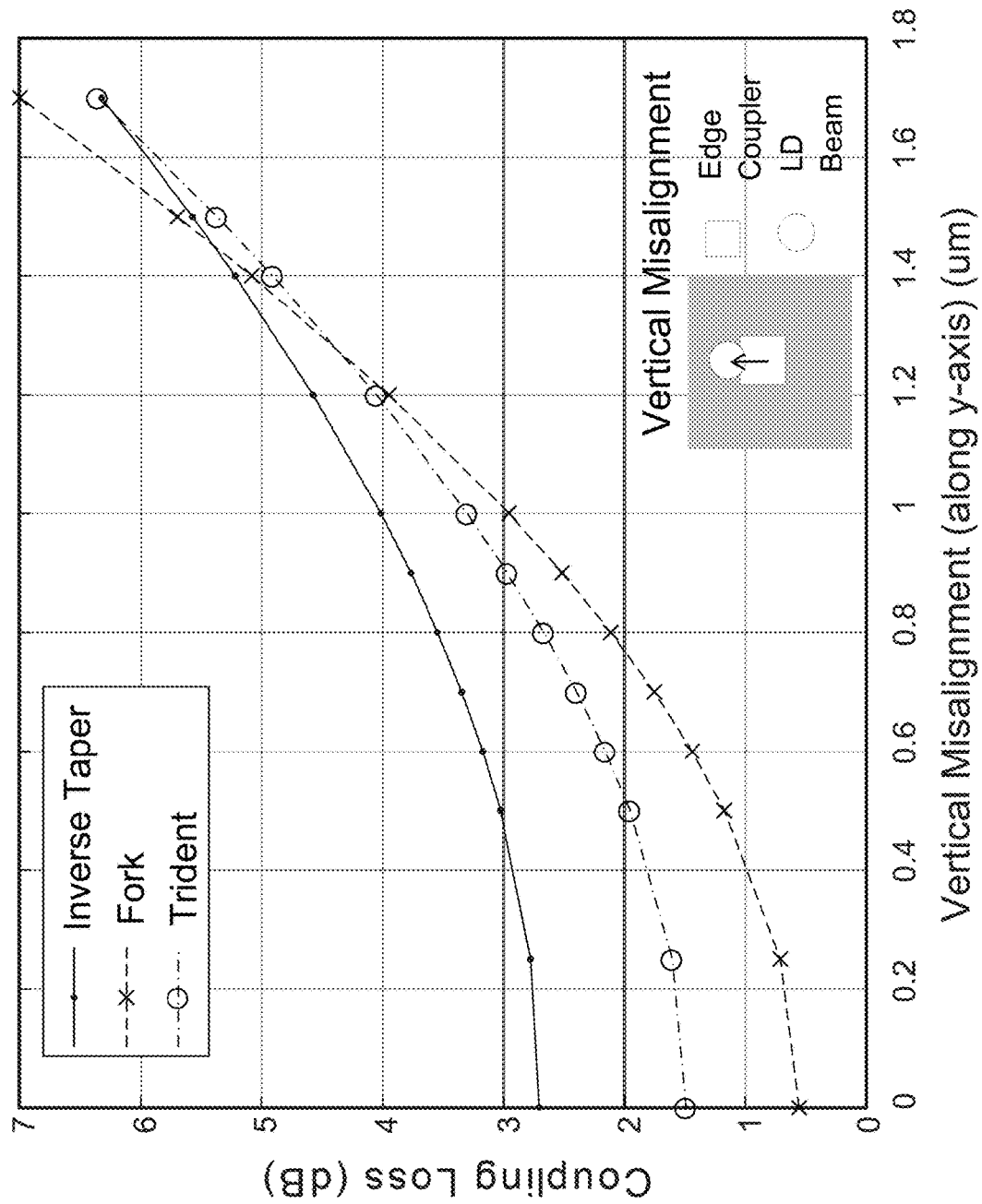
FIG. 14B is an exemplary diagram of a relationship between coupling loss and a vertical misalignment for the integrated coupler coupled between the tunable filter and a laser diode chip according to the embodiment of the present invention.

FIG. 14A is an exemplary diagram of a relationship between coupling loss and a lateral misalignment for an integrated coupler coupled between the tunable filter and a laser diode chip according to an embodiment of the present invention. This diagram is merely an example, which should not unduly limit the scope of the claims. One of ordinary skill in the art would recognize many variations, alternatives, and modifications. As shown, SiN Trident and SiN Fork type integrated couplers offset lower coupling loss alternative to SiN Inverse Nanotaper type integrated coupler with comparable tolerance to misalignment in lateral axis between a laser beam coming out of the laser diode chip and mode diameter of the integrated coupler. In the example, the coupling loss from mode mismatch based on 2.5 µm laser diode spot size. FIG. 14B is an exemplary diagram of a relationship between coupling loss and a vertical misalignment for the integrated coupler coupled between the tunable filter and a laser diode chip according to the embodiment of the present invention. This diagram is merely an example, which should not unduly limit the scope of the claims. One of ordinary skill in the art would recognize many variations, alternatives, and modifications. As shown, SiN Trident and SiN Fork type integrated couplers offset lower coupling loss alternative to SiN Inverse Nanotaper type integrated coupler with comparable tolerance to misalignment in vertical axis between a laser beam coming out of the laser diode chip and mode diameter of the integrated coupler. Additionally, the SiN Fork type integrated coupler offers more compact design than SiN Trident type integrated coupler with lower coupling loss (e.g., less than 1 dB). In an example, the Fork type integrated coupler has just half length of the Trident type integrated coupler. In an example, the coupling loss for the Fork type is just half of that for Trident type when the misalignment is less than 0.6 µm in both lateral or vertical direction.

In an embodiment, the coherent optical transceiver is integrated in a single chip. FIG. 15A shows a perspective view of a coherent optical transceiver chip is integrated on a silicon photonics substrate. FIG. 15B shows a side view of the coherent optical transceiver chip. Referring to FIG. 15A, a silicon photonics substrate 100 is provided its top surface as a substrate for integrating all components of a coherent optical transceiver chip 5000. The coherent optical transceiver chip 5000 has a fiber-coupler 520 configured to hold a first fiber 511 and a second fiber 512 respectively coupled with the silicon photonics substrate 100. The coherent optical transceiver chip 5000 includes a tunable laser device 1000 including two laser diode (LD) chips, a first LD 430 and a second LD 440, both flip-mounted onto a first region of the silicon photonics substrate 100. Both LD chips 430 and 440 are coupled with a wavelength tunable section embedded in the first region as depicted in the FIG. 15A. The tunable laser device 1000 is substantially similar to the tunable laser 40 shown in FIG. 6. The two laser diode chips 430 and 440 are configured to have p-side electrodes of respective two gain regions (referred to 430 and 440 too) facing down to mount on the silicon photonics substrate 100. The substrate 100 is prepatterned with a plurality of surface fiducials, vertical stoppers, edge stoppers, and bond pads for mounting and aligning the LD chips. The mounting of the LD chips 430 and 440 allows respective backend facets of the two gain regions to be aligned optically with the wavelength tuning filter 470 and a wavelength locker 480. At the same time, the mounting of the LD chip 430 allows its front-end facet of the first gain region to output the laser light coupled into a waveguide that leads to a silicon photonics circuit. Optionally, the wavelength tunable filter 470 and the wavelength locker 480 are directly made by wire waveguides in the first region of the silicon photonics substrate 100. Optionally, they are made by silicon and silicon related materials embedded into the silicon photonics substrate 100. In particular, the wavelength locker 480 includes a delay-line interferometer and multiple optical power monitors made by silicon or silicon nitride waveguides. The wavelength tunable filter 470 includes two or more micro-ring resonator waveguides 471 and 472 followed by linear waveguides 491 and 475 respectively coupled to the first gain region 430 and the second gain region 440. The two or more ring resonators have slightly different radii to allow a light coupled from the two gain regions being reflected therein multiple times with at least 90% reflectivity and being tuned in an extended wavelength range of synthesized spectrum by at least one resistive heater partially overlying each of the two or more micro-ring resonator waveguides and a heater overlying a section of linear waveguide 475 as a phase shifter. Optionally, the power supplies for the resistive heaters and LD driver are provided through electrical connections embedded in the substrate 100 and multiple through-silicon vias (TSVs) in the substrate 100 to connect with some of conducting bumps of the board grid array (BGA) at a bottom surface of the substrate 100 (as seen in FIG. 15B).

In the embodiment, the coherent optical transceiver chip 5000 further includes a transimpedance amplifier (TIA) chip 3400 flip-mounted on a second region of the silicon photonics substrate 100. The TIA chip 3400 is electrically coupled to corresponding electrical connections embedded in the substrate 100 or through some TSVs connected to BGA at the bottom surface of the substrate 100. A printed circuit board (PCB) can be used to mount the silicon photonics substrate 100 to provide desired electrical connection for the TIA chip for operating the optical transceiver 5000. Optionally, the TIA chip 3400 is configured to prepare some voltage signals converted from some hybrid current signals detected from incoming coherent light signals. Additionally, the coherent optical transceiver chip 5000 includes a driver chip 2600 flip-mounted on a third region of the silicon photonics substrate 100. The driver chip 2600 is electrically coupled to corresponding electrical connections embedded in the substrate 100 or through some TSVs connected to BGA at the bottom surface of the substrate 100, and to utilize the PCB for completing the electrical connections.

Furthermore, the coherent optical transceiver chip 5000 includes a silicon photonics circuit integrated with the tunable laser device 1000, the TIA chip 3400 and the driver chip 2600. The silicon photonics circuit is directly formed in a fourth region of the silicon photonics substrate 100 which is substantially sunken into the substrate 100. Optionally, the silicon photonics circuit includes several silicon photonics devices respectively formed in different geometrical portions of the fourth region. Functionally, as shown in FIG. 1, the silicon photonics circuit includes mainly a receiver block 3000 and a transmitter block 2000. Referring to FIG. 1 and FIG. 15A, the receiver block 2000 is configured to have a waveguide (not explicitly shown) coupled with the first fiber 511 to receive a coherent input light signal and to have another waveguide (not explicitly shown) coupled with the tunable laser device 1000 to receive a first portion of a laser light as local oscillator signals to assist detections of both TM-mode and TE-mode light signals in the coherent input light signal by the TIA chip 3400. The transmitter block 2000 is configured to use the driver chip 2600 to drive modulations of a second portion of the laser light from the tunable laser device 1000 to generate a coherent output light signal outputted to the second fiber 512.

Referring to FIG. 15A, although no details are explicitly shown, the silicon photonics circuit includes a first power splitter 1001 formed in the substrate 100 having an input waveguide 1010 coupled and aligned to the front-end facet of the first gain region 430 to receive the laser light outputted therefrom. The first power splitter 1001 is configured to split the laser light to two portions, a first portion outputted to a first output waveguide 1011 and a second output waveguide 1012 with an X:Y ratio ranging from 10:90 to 50:50. The silicon photonics circuit includes a sub-circuit having at least a polarization beam splitter rotator (PBSR), a second power splitter, and a pair of optical receivers, configured as a receiver block 3000 shown in FIG. 1, integrated in one sub-region 3101 of the fourth region in the silicon photonics substrate 100. Functionally, the polarization beam splitter rotator 3100 has an input waveguide directly coupled to the first fiber 511 at an edge of the silicon photonics substrate 100 to receive a coherent input light signal. The PBSR 3100 is configured as a shaped silicon waveguide (see FIG. 2A) to receive the coherent input light signal and output the TE-mode light signal of the coherent input light signal and a TM*-mode light signal to two separate optical paths respectively fed to the two 90° hybrid optical receivers 3200 and 3300. The TM*-mode light signal is essentially a TE-mode light signal rotated 90° from the TM-mode light signal of the coherent input light signal. The second power splitter 3001 is essentially a 3 dB coupler to split the first portion of the laser light coming from the first output waveguide 1011 of the first power splitter 1001 to two equal halves. Each half of the laser light is used as a local oscillator signal inputted to a respective one of the two 90° hybrid optical receivers 3200 and 3300 to combine with the respective TE- and TM*-mode light signal to form a first hybrid light signal and a second hybrid light signal. Correspondingly, the two 90° hybrid optical receivers 3200 and 3300 includes photo diodes configured to respectively convert the first hybrid light signal and a second hybrid light signal to a first hybrid current signal and a second hybrid current signal.

Referring to FIG. 15A, the silicon photonics circuit also includes a polarization beam rotator combiner (PBRC) and a pair of optical modulators configured as a transmitter block 2000 shown in FIG. 1, integrated respective two sub-regions 2301 and 2302 of the fourth region in the silicon photonics substrate 100. Particularly, each of the pair of optical modulators includes a silicon-waveguide based Mach-Zehnder interferometer configured as in-phase/quadrature-phase modulator having one in-phase branch and one quadrature-phase branch with a 90° phase shifter, each branch being biased by voltages provided from the driver chip 2600 to drive modulations to light received from the second portion of the laser light coming from the second output waveguide 1012 of the first power splitter 1001 and passing through the silicon waveguides of the modulator itself. Each modulator is configured to output a modulated light signal with I/Q four-level modulations substantially in TE-mode polarization originated from the laser light from the tunable laser device 1000. The PBRC 2200 is coupled to the two in-phase/quadrature-phase modulators to receive the two TE-mode modulated light signals, output one retaining the TE-mode modulated light signal while another one being rotated to a TM-mode modulated light signal, and combine the TE-mode modulated light signal with the TM-mode modulated light signal to a coherent modulated light signal. Referring to FIG. 15A, the silicon photonics circuit further includes a polarization-independent semiconductor optical amplifier (PI-SOA) 2100 as a chip flip-mounted on the silicon photonics substrate 100 near an edge to couple with the PBRC 2200 at one end and couple with the second fiber 512 at an opposite end. The PI-SOA 2100 is configured to provide a wide range of output power of the coherent modulated light signal. Further, the PI-SOA 2100 delivers the amplified coherent light signal to the second fiber outputted to the output port as a coherent output light signal.

FIG. 15B shows a side view of the coherent optical transceiver chip 5000 of FIG. 15A. As shown, the coherent optical transceiver 5000 is integrated on the single silicon photonics substrate 100. The silicon photonics substrate 100 is a silicon photonics chip comprising waveguides made by silicon-related materials formed in a silicon-on-insulator substrate. A top surface of the silicon photonics substrate 100 is configured to allow multiple functional chips like TIA chip 3400, driver chip 2600, laser diodes chip 430 and 440, and semiconductor optical amplifier 2100 to be mounted at respective regions. Optionally, each of these chips is flip-mounted with conductive bumps 170 facing down to bound with pre-formed bumps on the respective regions. Optionally, a plurality of conductive through-silicon vias can be formed through the silicon photonics substrate 100 and filled with conductive materials for connecting those chips mounted on top thereof to some of board grid array 160 at bottom thereof. Optionally, the board grid array 160 is designed for mounting this integrated coherent optical transceiver 5000 on the silicon photonics substrate 100 onto a printed circuit board in a modular package.

In another aspect, the present disclosure provides a compact package for an integrated coherent optical transceiver formed on a single silicon photonics chip. FIG. 16A is a schematic diagram of an open package of an integrated coherent optical transceiver according to an embodiment of the present invention. FIG. 16B shows a closed package of the integrated coherent optical transceiver of FIG. 16A according to the embodiment of the present disclosure. This diagram is merely an example, which should not unduly limit the scope of the claims. One of ordinary skill in the art would recognize many variations, alternatives, and modifications. As shown, the closed package 6000A is a fully cased coherent optical transceiver. The open package 6000 is with a lid member 150 being removed. The package 6000 includes an integrated coherent optical transceiver 5000 mounted on a printed circuit board (PCB) 600 in a metal case. The metal case is, in addition to the lid member 150, assembled together with a pair of side members 140 naturally connected by a joint member 141 near a front-end region of the case and a bottom member 130 extending the joint member 141 to a back end 131 of the case. The pair of side members 140 has a pair of clip structures 145 to couple with the lid member 150. The PCB 600 has its board body supported on the bottom member 130 with multiple conductive pins 610 formed at an end region of the board body substantially located at the backend region 131 of the case. The package includes a first optical connector receptor 501 configured as an input port and a second optical connector receptor 502 configured as an output port for the transceiver 6000. Both input port and the output port are located on the joint member 141 before the front end of the PCB board body 600.

The integrated coherent optical transceiver on the silicon photonics substrate 100 is substantially the coherent optical transceiver chip 5000 shown in FIG. 15A. Details of the coherent optical transceiver chip 5000 can be found in several earlier paragraphs. The first optical connector receptor 501 has its back end coupled with a first fiber 511 and the second optical connector receptor 502 has its back end coupled with a second fiber 512, both being held by a fiber-coupler 520 to respectively couple and optically align with an input waveguide into a silicon photonics circuit built in the silicon photonics substrate 100 and an output waveguide connected from a polarization-independent semiconductor optical amplifier (PI-SOA) 2100. Optionally, the first optical connector receptor 501 has its front end configured to mate with an optical connector connected to an input fiber delivering a coherent input light signal with mixed TE- and TM-mode from an optical communication system. The second optical connector receptor 502 has its front end configured to mate with an optical connector connected to an output fiber for outputting a coherent output light signal with four-level I/Q modulation in both TE-mode and TM-mode polarizations. Depending on applications, the integrated coherent transceiver package 6000A can be configured with a compact form factor that adapts with any system design for coherent optical communication.

In an alternative aspect, the present disclosure provides a light engine device including an optical coherent transceiver integrated on a semiconductor substrate member. For example, the optical coherent transceiver is provided as the integrated coherent optical transceiver shown in FIG. 1. For example, the substrate member is provided as one like the substrate 100 of FIG. 15B. The light engine device includes a substrate member comprising a surface region. The light engine device further includes an optical input configured to an incoming fiber device and an optical output configured to an outgoing fiber device. Additionally, the light engine device includes a transmit path provided on the surface region. The transmit path includes a polarization independent optical amplifier device coupled to the optical output. The transmit path also includes a polarization beam rotator combiner device coupled to the polarization independent optical amplifier and coupled to the optical output. The transmit path further includes a dual polarization I/Q Mach Zehnder modulator device coupled to the polarization beam rotator combiner device and coupled to the optical output. The transmit path again includes a driver device coupled to the dual polarization I/Q Mach Zehnder modulator device and configured to drive an electrical signal to the dual polarization I/Q Mach Zehnder modulator. Furthermore, the transmit path includes a tunable laser device comprising a laser diode chip having a gain region with a p-side electrode flipped down and mounted on the substrate member. The gain region is coupled with a wavelength tuning section formed in the substrate member to tune wavelengths of a laser light outputted from the gain region to a waveguide in the substrate member. Moreover, the transmit path includes a first power splitter coupled to the waveguide to split the laser light to a first light and a second light. The second light is coupled to the dual polarization I/Q Mach Zehnder modulator device. Further, the light engine device also includes a receive path provided on the surface region. The receive path includes a second power splitter coupled to the first light. The receive path further includes a pair of 90° hybrid receivers. Each of the pair of 90° hybrid receivers includes a photo detector device and a hybrid mixer device, coupled respectively to two outputs of a polarization beam splitter rotator in the substrate member to receive the optical input and to two outputs of the second power splitter to receive the first light from the tunable laser device for assisting detections of a transverse electric (TE) mode signal and a transverse magnetic (TM) mode signal in the coherent input signal. Furthermore, the receive path includes a transimpedance amplifier coupled to each of the 90° hybrid receivers and coupled to each of the photo detector devices that convert a combination of the first light with the optical input into an electrical signal to be transmitted to using the transimpedance amplifier device. The light engine device further includes a heterogeneous integration configured using the substrate member, the transmit path, and the receive path to form a single silicon photonics device.

Optionally, the substrate member comprises a silicon substrate. Optionally, the transimpedance amplifier is made of a silicon germanium bipolar technology. Optionally, the transimpedance amplifier is made of a silicon CMOS technology. Optionally, the transimpedance amplifier is made of an indium phosphide technology. Optionally, the transimpedance amplifier is made of a gallium arsenide containing technology. Optionally, the data center is configured for a social networking platform, an electronic commerce platform, an artificial intelligence platform, or a human tracking platform. Optionally, Optionally, the light engine device is coupled to a major substrate member. The major substrate member, for example, provided as a circuit board 600 of FIG. 16A, is configured to mount the light engine device, a digital signal processing device coupled to the light engine device, a power supply coupled to the light engine device and the digital signal processing device, a micro-controller device coupled to the light engine device to provide one or more controls using one or more control signals to the light engine device, an electrical input and output configured to the light engine device, the digital signal processing device, the power supply, and the micro-controller device; and a mechanical and electrical configuration including the light engine device, the digital signal processing device, the power supply, the micro-controller device, and the electrical input and output configured to the light engine device, the digital signal processor device, the power supply and the micro-controller device.

Optionally, the light engine device and the major substrate member are configured as a pluggable device. Optionally, the light engine device and the major substrate member together are configured on a system board member of a communication system intended for data transmitting and receiving. Optionally, the system board member is provided in a switch system apparatus, the switch system apparatus being spatially disposed in a data center. Optionally, the data center is configured for a social networking platform, an electronic commerce platform, an artificial intelligence platform, or a human tracking platform. Optionally, the data center is coupled to a plurality of data centers spatially located throughout a geographical region. Optionally, the data center is owned by a commercial company or a government entity.

Optionally, the digital signal processing device includes a host interface to a switch device and a line interface to the light engine device.

Optionally, the major substrate member includes an electrical interface to the system board member, an optical interface to the system board member, and a mechanical interface to the system board member. Optionally, the mechanical interface is thermally configured using an attachment device to the system board member using a thermal interface region coupled to the attachment device.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated coherent transceiver comprising:
   a substrate member;
   a laser diode chip mounted on the substrate member to couple with a wavelength tuning section of a waveguide in the substrate member;
   a first splitter coupled to the waveguide to split a laser light emitted by the laser diode chip to a first light and a second light;
   a coherent receiver configured to receive signals having multiple modulation formats, the coherent receiver comprising:
      a polarization beam splitter rotator formed in the substrate member and configured to split a coherent input signal to two outputs corresponding to separate output paths in the substrate member;
      a second splitter formed in the substrate member and configured to split the first light to two local-oscillator signals; and
      at least two 90° hybrid receivers coupled to outputs of the polarization beam splitter rotator and outputs of the second splitter in the substrate member and configured to detect a transverse electric (TE) mode signal and a transverse magnetic (TM) mode signal in the coherent input signal based on the two local-oscillator signals; and
   a coherent transmitter configured to transmit signals having multiple modulation formats, the coherent transmitter comprising at least a pair of in-phase/quadrature-phase modulators configured in the substrate member to respectively modulate two parts split from the second light to two I/O-modulated signals in a TE-mode, the coherent transmitter configured to rotate one of the two I/O modulated signals to a TM-mode signal and combine with the other one of two I/O modulated signals in the TE-mode to generate a coherent output signal.

2. The integrated coherent transceiver of claim 1 wherein the substrate member is one of a silicon photonics and a planar light circuit substrate.

3. The integrated coherent transceiver of claim 1 wherein the laser diode chip comprises a gain region having a first end facet aligned to an edge stopper of a first integrated coupler in the substrate member for passing the laser light generated in the gain region into the wavelength tuning section and a second end facet aligned to a second integrated coupler to output the laser light to the waveguide, the gain region having a p-type electrode facing the substrate member.

4. The integrated coherent transceiver of claim 3 wherein the wavelength tuning section comprises a straight waveguide section coupled to at least two micro-ring resonators wire followed by a reflector section, the straight waveguide section being directly coupled to the first integrated coupler to receive a light generated in the gain region, the at least two ring resonators having slightly different radii to allow the light to be tuned in an extended wavelength range of a synthesized spectrum, and the reflector section being characterized with at least 90% reflectivity of the light.

5. The integrated coherent transceiver of claim 4 wherein the straight section comprises Silk material, and the at least two ring resonators and the reflector section comprise Si material.

6. The integrated coherent transceiver of claim 4 wherein the wavelength tuning section further comprises at least three thin-film resistor heaters placed on the substrate member respectively and at least partially over the at least two ring resonators and the reflector section.

7. The integrated coherent transceiver of claim 6 wherein the thin-film resistor heaters placed over the at least two ring resonators are configured to tune the light in the extended wavelength range at least from 1530 nm to 1570 nm and the thin-film resistor heater placed over the reflector section is configured to tune phase of the light to match a round trip cavity lasing condition between the first end facet and the second end facet of the gain region.

8. The integrated coherent transceiver of claim 1 wherein the laser diode chip comprises two laser diode chips flip-mounted on the substrate member to provide two active gain regions coupled to a wavelength tuning section and a wavelength locker with three photodiodes integrated in the substrate member.

9. The integrated coherent transceiver of claim 1 wherein the first splitter is configured in the substrate member to split the first light and the second light with an X:Y ratio in a range from 10:90 to 50:50.

10. The integrated coherent transceiver of claim 1 wherein the second splitter configured in the substrate member to split the first light into the two local oscillator signals.

11. The integrated coherent transceiver of claim 1 polarization beam splitter rotator comprises a rib structure waveguide formed in the substrate member configured to convert a TM-mode polarization of an incoming light from an input port to a substantial TE-like polarization, the incoming light being the coherent input light as received from a coherent optical network.

12. The integrated coherent transceiver of claim 11 wherein the polarization beam splitter rotator comprises a double-taper structure waveguide configured as a 50:50 splitter following the rib structure waveguide.

13. The integrated coherent transceiver of claim 12 wherein the polarization beam splitter rotator comprises a dual-branch shaped waveguide coupled to the double-taper structure waveguide and configured to provide one branch with extra 90° phase shift to the light wave traveling thereof.

14. The integrated coherent transceiver of claim 13 wherein the polarization beam splitter rotator comprises a rectangular-shaped waveguide coupled to the dual-branch shaped waveguide and configured as a 2×2 multi-mode interferometer to output a TE-mode polarization light to a first port and TM-mode polarization light to a second port upon receiving a-coherent light input via the input port of the rib structure waveguide.

15. The integrated coherent transceiver of claim 1 wherein one of the at least two 90' hybrid receivers is configured as a TE 90° hybrid receiver to convert a hybrid light signal combining the TE-mode signal in the coherent input signal and a first TE-mode local-oscillator signal split from the first light from the laser diode chip to a first hybrid current signal for detecting the TE-mode signal in the coherent input signal, and another one of the at least two 90° hybrid receivers is configured as a TM* 90' hybrid receiver to convert a hybrid light signal combining a TE-mode signal rotated from the TM-mode signal in the coherent input signal and a second TE-mode local-oscillator signal split from the first light from the laser diode chip to a second hybrid current signal for detecting the TM-mode signal in the coherent input signal.

16. The integrated coherent transceiver of claim 15 further comprising a transimpedance amplifier (TIA) chip flip-mounted on the substrate member and coupled to the TE 90° hybrid receiver to process the first hybrid current signal and coupled to the TM* 90° hybrid receiver to process the second hybrid current signal, and convert both the first hybrid current signal and the second hybrid current signal to digital signals.

17. The integrated coherent transceiver of claim 1 further comprising a driver chip flip-mounted on the substrate member and configured to provide bias power and driving signal to the at least a pair of in-phase/quadrature-phase modulators.

18. The integrated coherent transceiver of claim 1 further comprising a polarization beam rotator combiner that includes a shaped waveguide configured in the substrate member substantially the same as a polarization beam splitter rotator of the coherent receiver with a reversed optical path.

19. The integrated coherent transceiver of claim 1 wherein each of the pair of in-phase/quadrature-phase modulators comprises a Mach-Zehnder delay-line interferometer in each of an in-phase branch and a quadrature-phase branch which includes an additional 90° phase shifter.

20. The integrated coherent transceiver of claim 1 further comprising one or more optical attenuators integrated in two waveguides in the substrate member respectively coupled into two inputs of a polarization beam rotator combiner.

* * * * *